US005536955A

United States Patent [19]
Ali

[11] Patent Number: 5,536,955
[45] Date of Patent: Jul. 16, 1996

[54] ELECTRONIC DEVICES FOR USE IN GENERATING INTEGRATED CIRCUIT STRUCTURES AND METHOD THEREFOR

[75] Inventor: Akhtar Ali, Tucson, Ariz.

[73] Assignees: Toppan Electronics (USA) Inc.; Fast Custom Semiconductors, Calif.

[21] Appl. No.: 494,926

[22] Filed: Jun. 26, 1995

Related U.S. Application Data

[63] Continuation of Ser. No. 203,223, Feb. 28, 1994, abandoned, which is a continuation-in-part of Ser. No. 38,120, Mar. 29, 1993, abandoned.

[51] Int. Cl.$^6$ ................................................. H01L 27/10
[52] U.S. Cl. ........................................ 257/204; 257/369
[58] Field of Search ................................. 257/202, 204, 257/206, 207, 369; 364/490

[56] References Cited

U.S. PATENT DOCUMENTS

| | | | |
|---|---|---|---|
| 4,412,237 | 10/1983 | Matsumura et al. | 257/369 |
| 4,513,307 | 4/1985 | Brown | 257/204 |
| 4,627,152 | 12/1986 | DeHond et al. | 29/571 |
| 4,849,366 | 7/1989 | Hsu et al. | 437/48 |
| 4,884,115 | 11/1989 | Michel et al. | 257/206 |
| 5,097,422 | 3/1992 | Corbin, II et al. | 364/490 |
| 5,111,271 | 5/1992 | Hatada et al. | 257/207 |
| 5,214,299 | 5/1993 | Gal et al. | 257/204 |

FOREIGN PATENT DOCUMENTS

| 4-14153 | 5/1992 | Japan | 257/401 |
|---|---|---|---|

OTHER PUBLICATIONS

Neil H. E. Weste et al., Principles of CMOS VLSI Design, A Systems Perspective, 1993, 2nd edition.

Primary Examiner—Robert P. Limanek
Attorney, Agent, or Firm—Armstrong, Westerman, Hattori, McLeland & Naughton

[57] ABSTRACT

A device for use in rapidly generating integrated circuit structures is disclosed which provides a plurality of objects and primitives, each primitive having a well of one type of semiconductor conductivity, one FET device of the same conductivity type, one other FET device of an opposite conductivity type, a doped polysilicon conductor connecting together the gates of the FET devices, a positive voltage supply, and a negative or ground voltage supply. This device is particularly defined for rapid transformation into integrated circuit structures that produce integrated circuits having optimized cell structures, minimum overall circuit area, high performance, and reliability.

1 Claim, 27 Drawing Sheets

NW

PI

ND

PL

PI
AC
PD

MI

C1

C2

M2

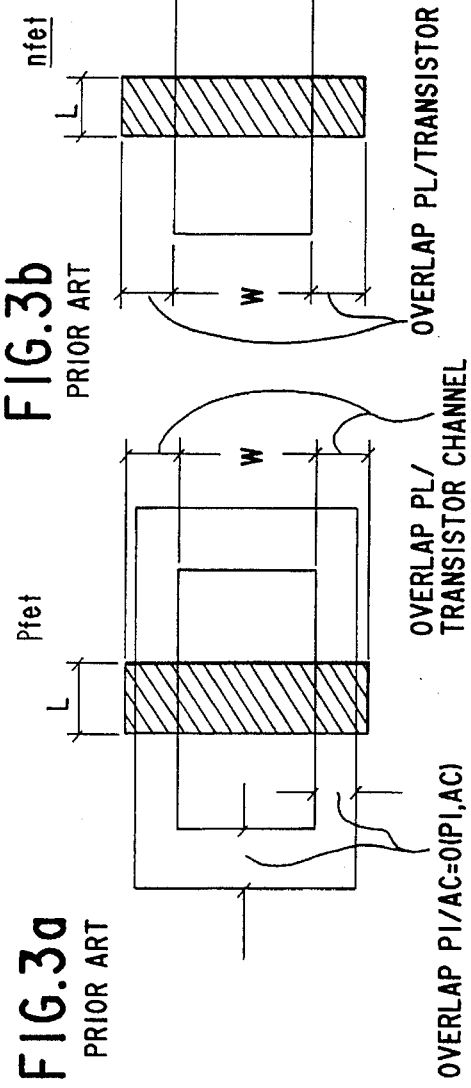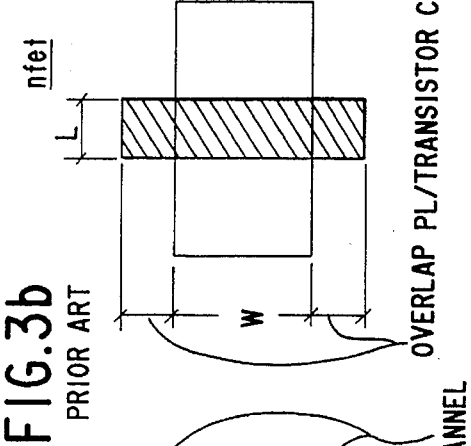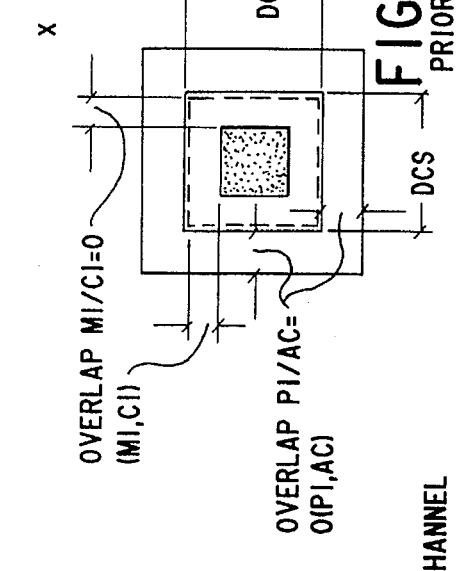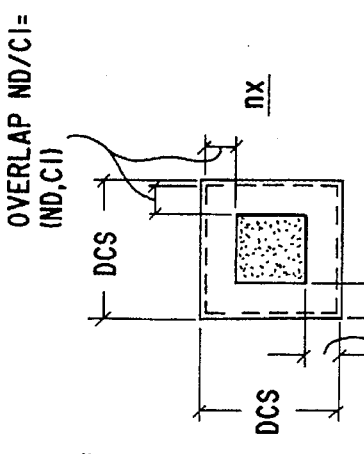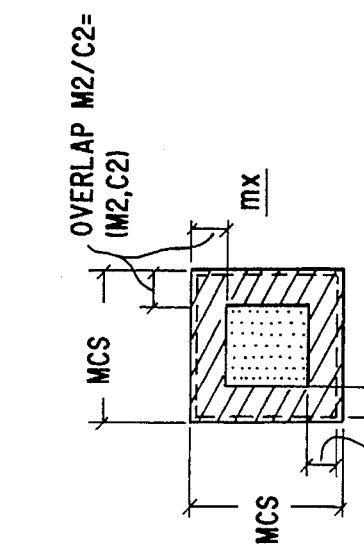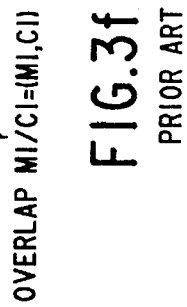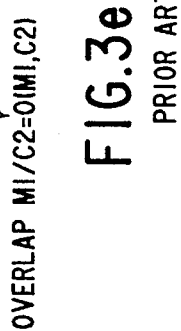

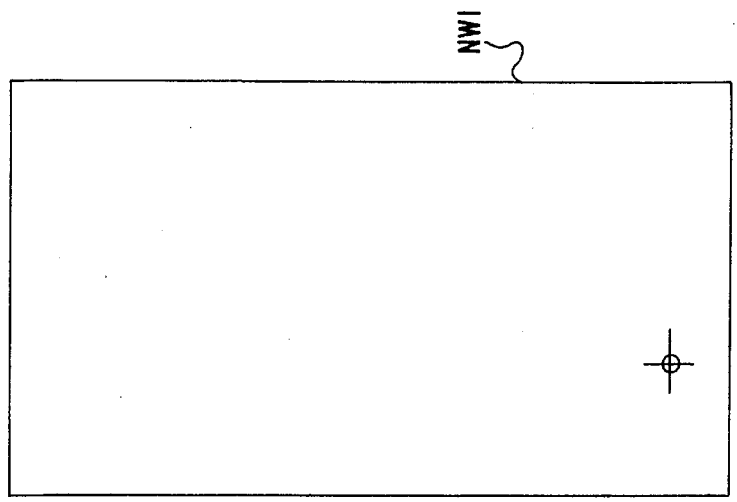
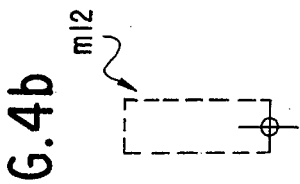
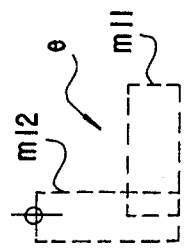
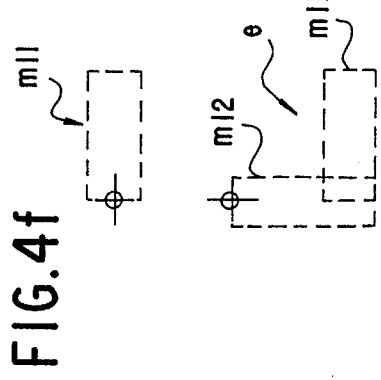
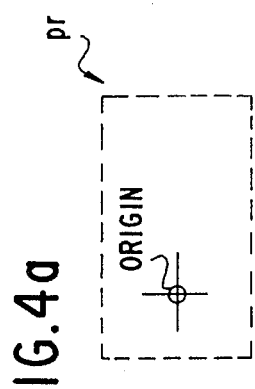
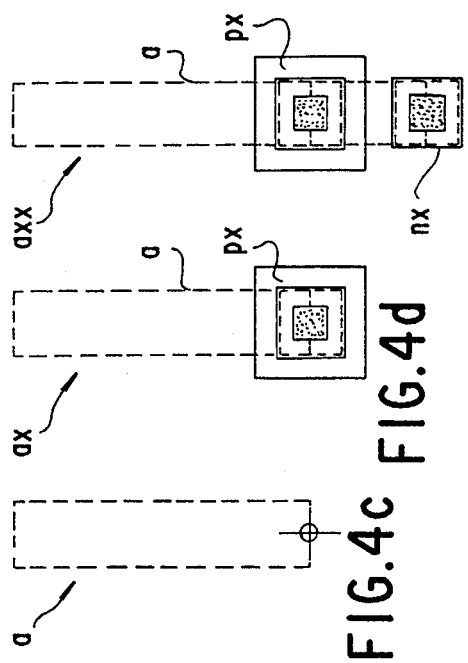

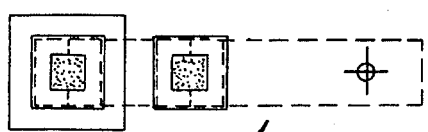
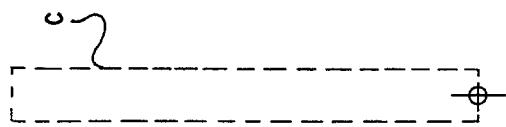
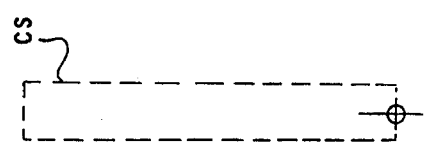
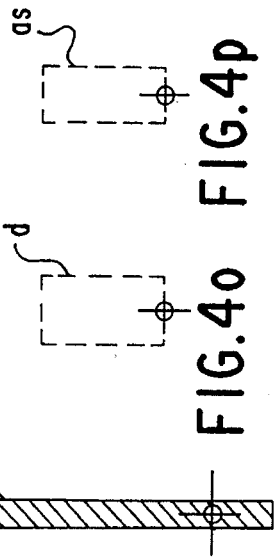
FIG.4i  FIG.4j  FIG.4k  FIG.4l  FIG.4m  FIG.4n  FIG.4o  FIG.4p

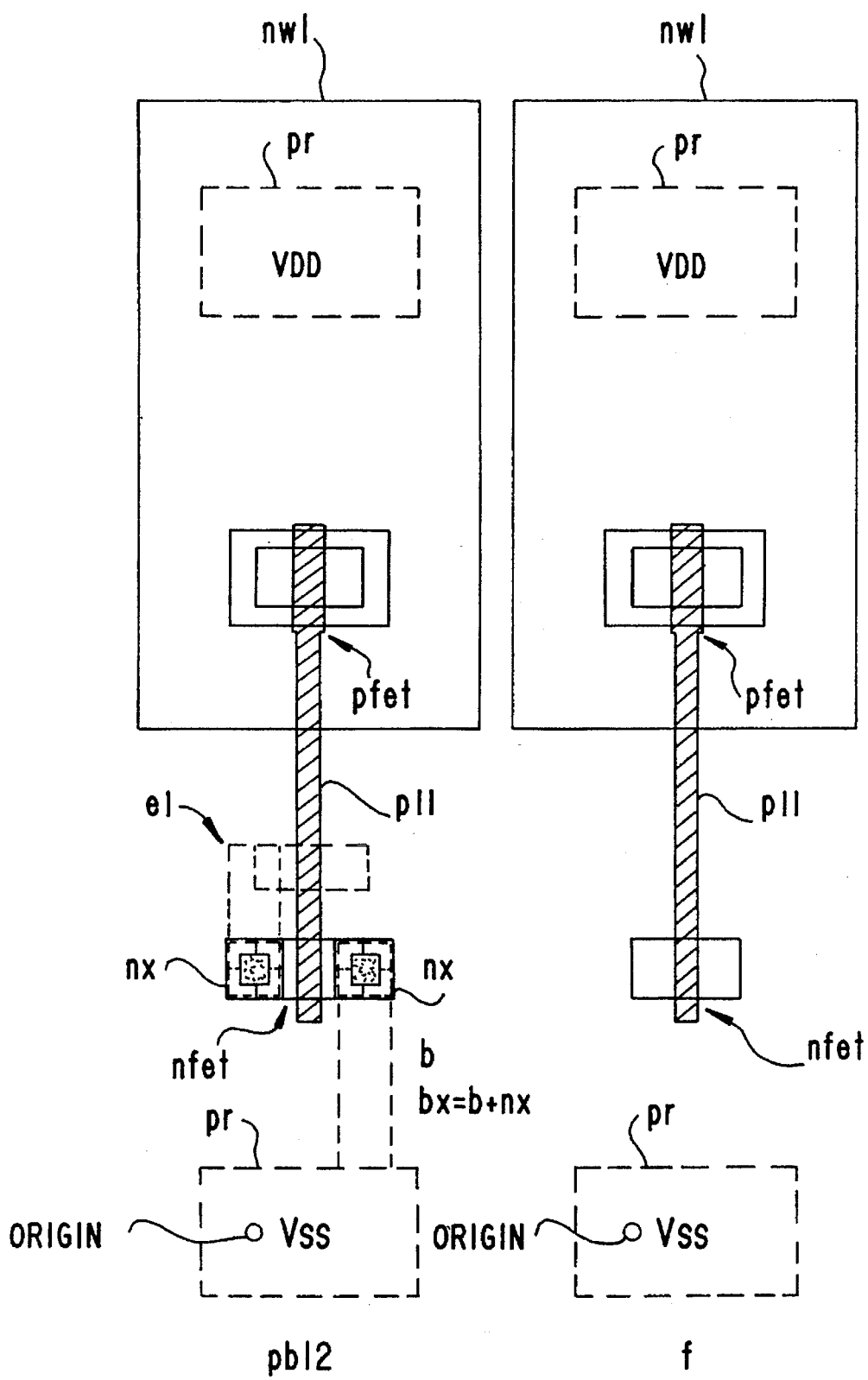

FIG.7d FIG.7e
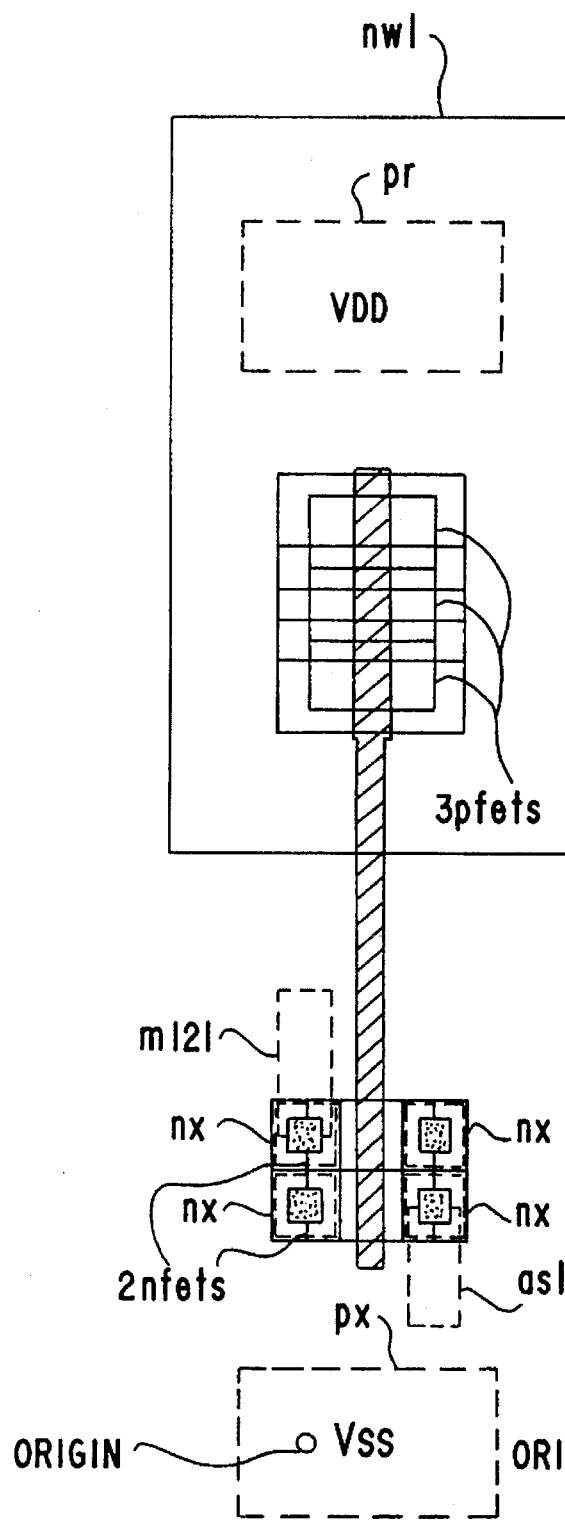
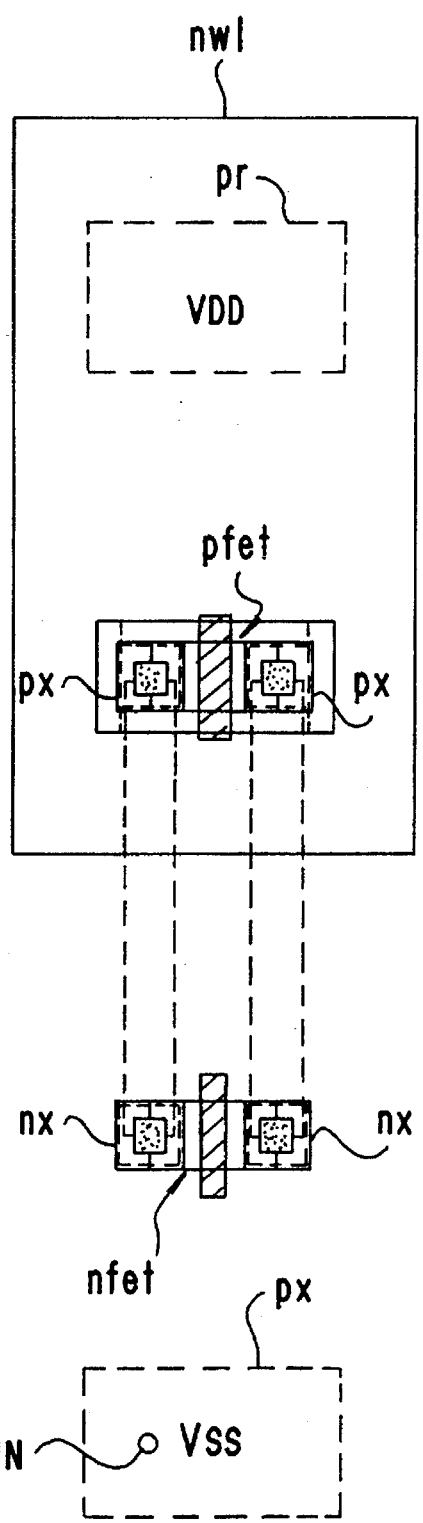
pb22     ft

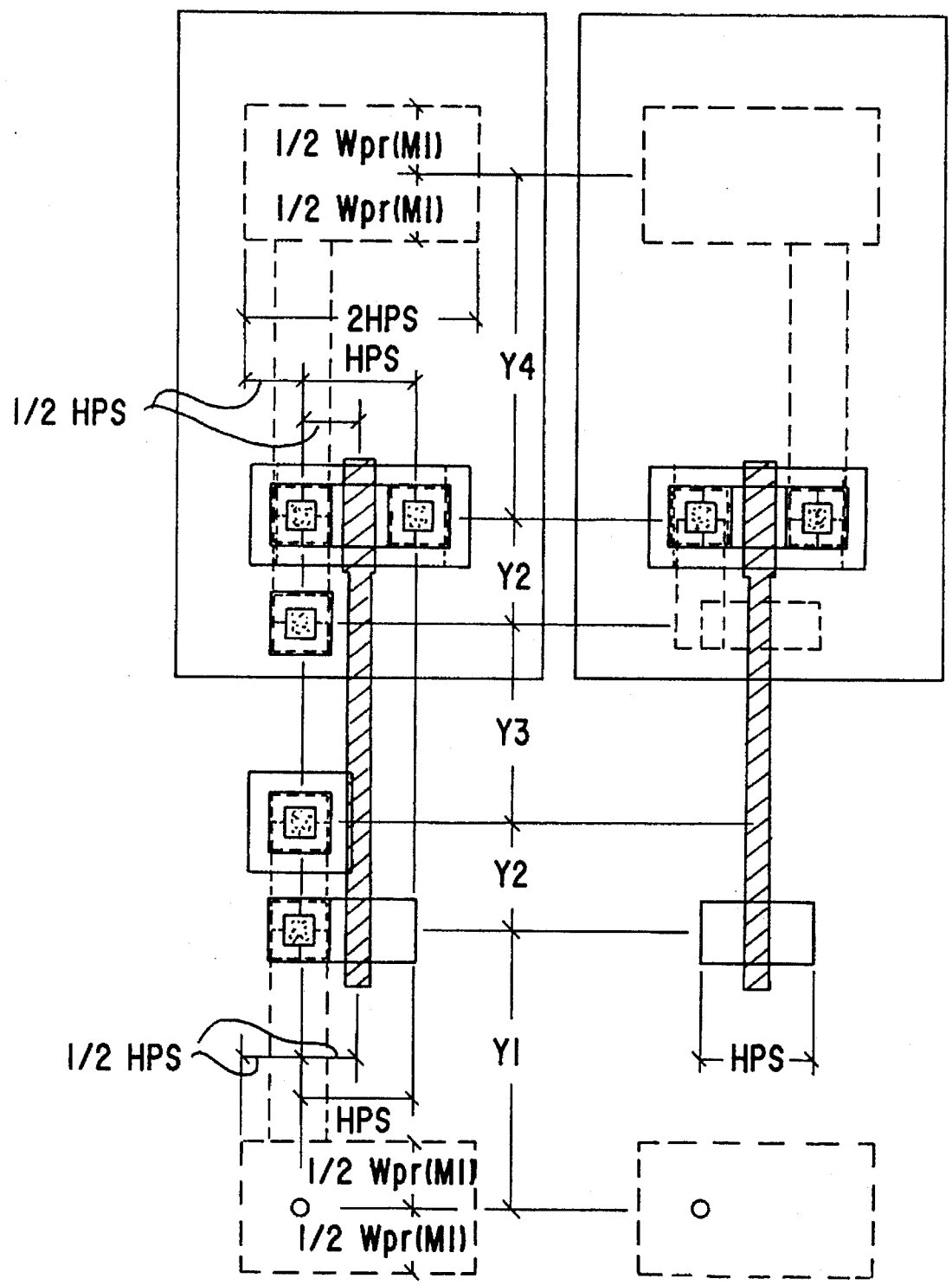

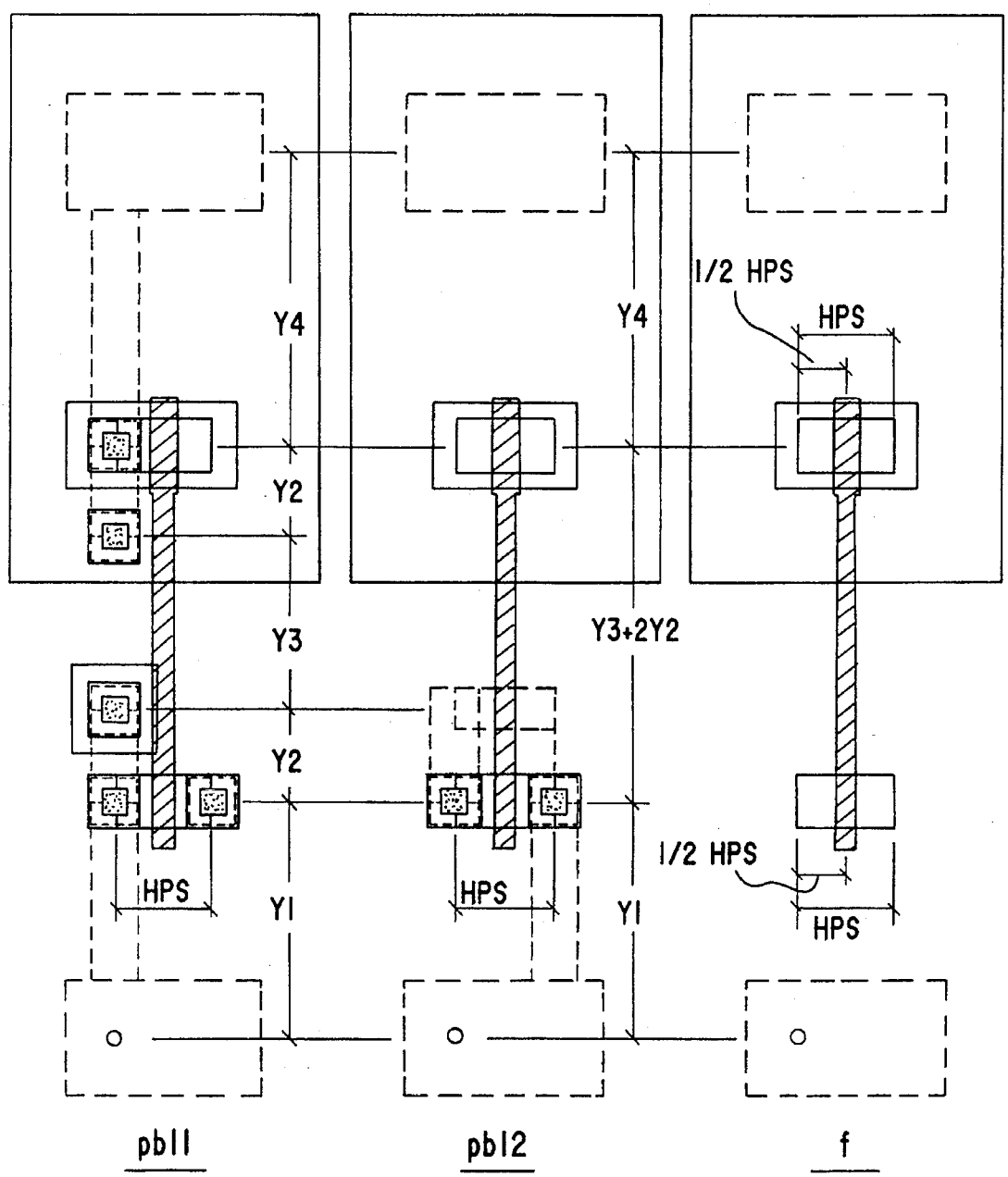

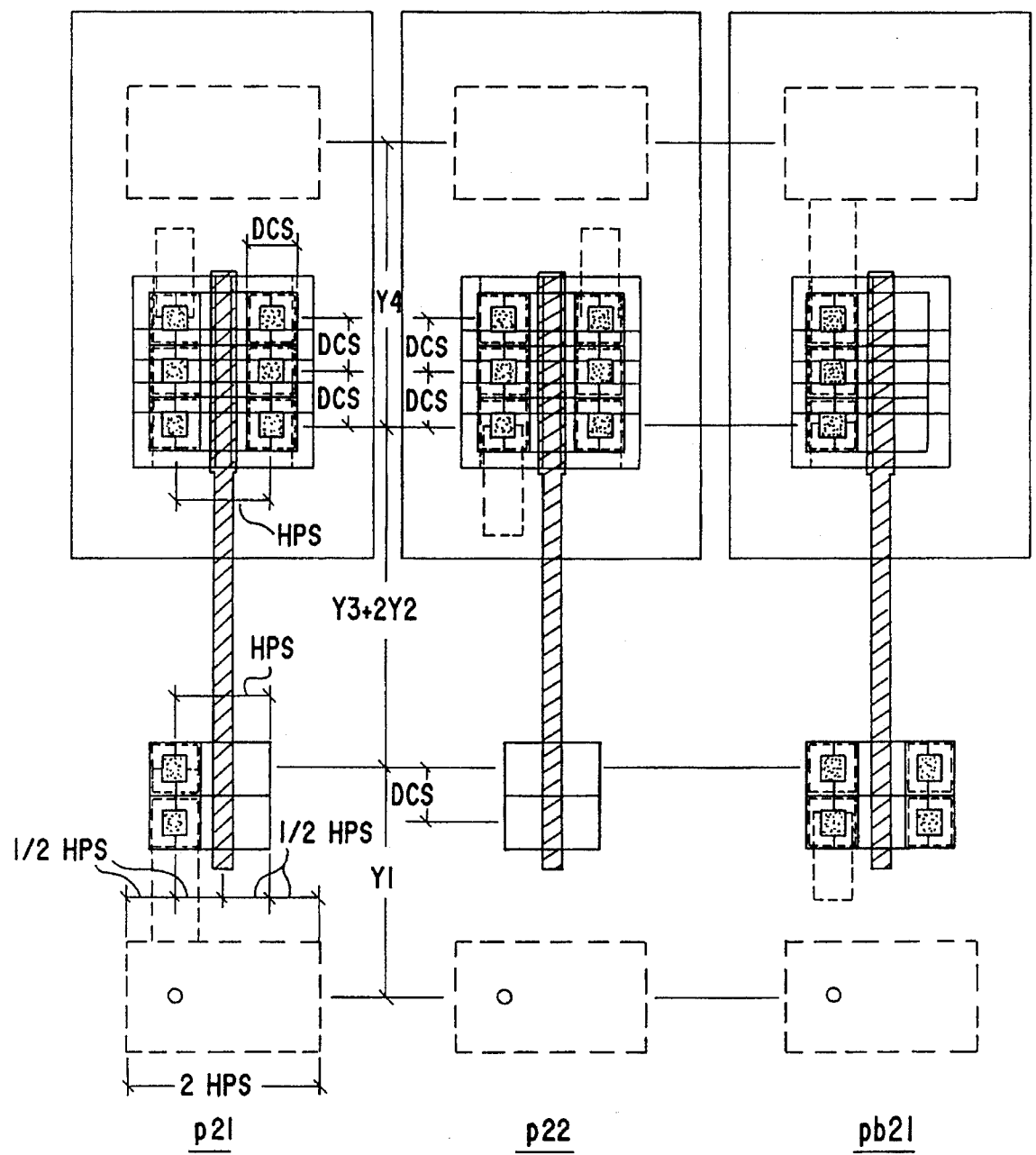

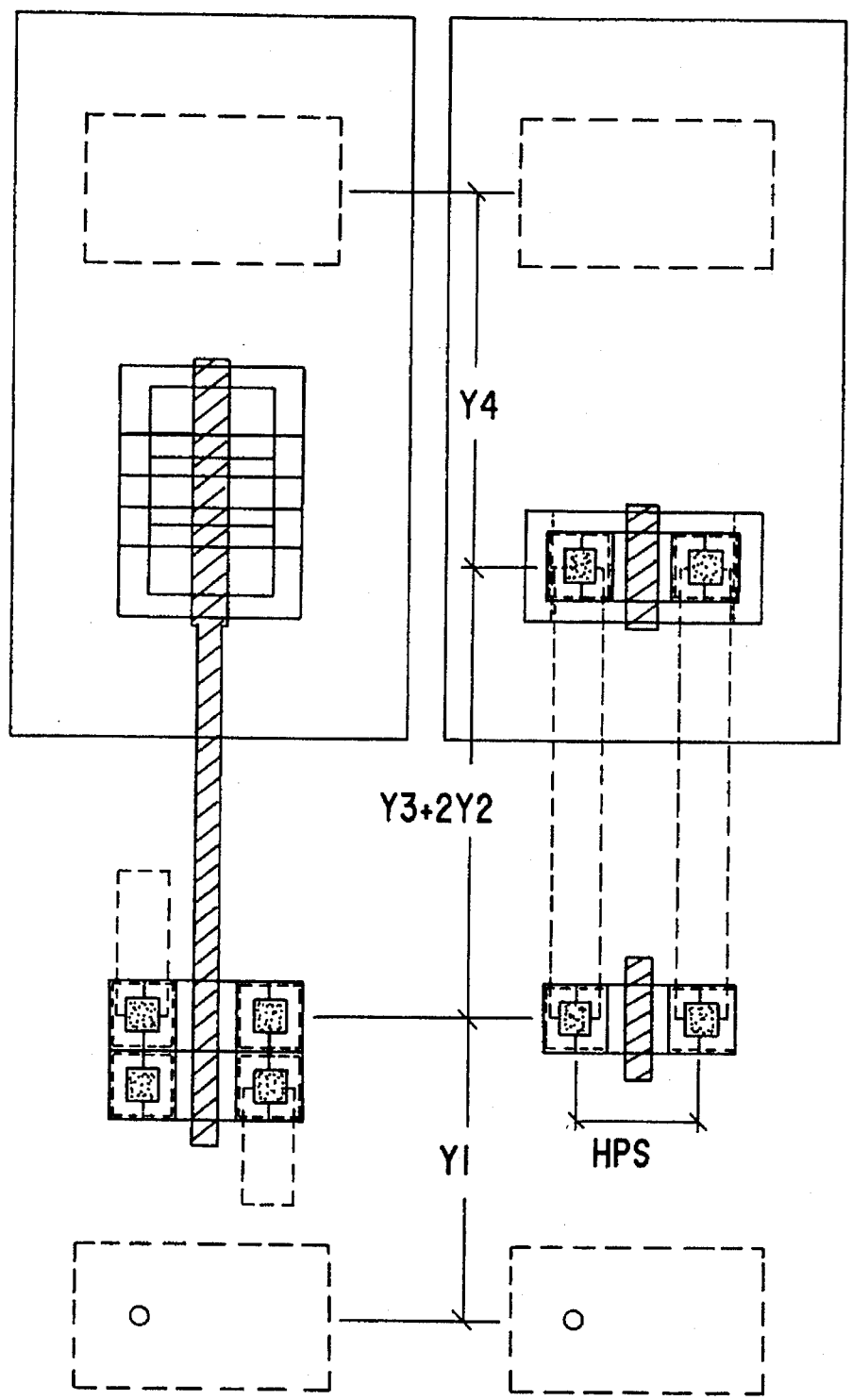

| LEGEND | |
|---|---|
| OBJECT | LOCATION (h,v) |
| pr | (0,0), (0,12) |
| nfet | (0,3) |
| pll | (0,5) |
| nwl | (0,7) |
| pfet | (0,8) |

(h,v) ARE COORDINATES OF THE ORIGIN
POINTS OF THE CORRESPONDING OBJECTS.
h=HORIZONTAL COORDINATE
v=VERTICAL COORDINATE

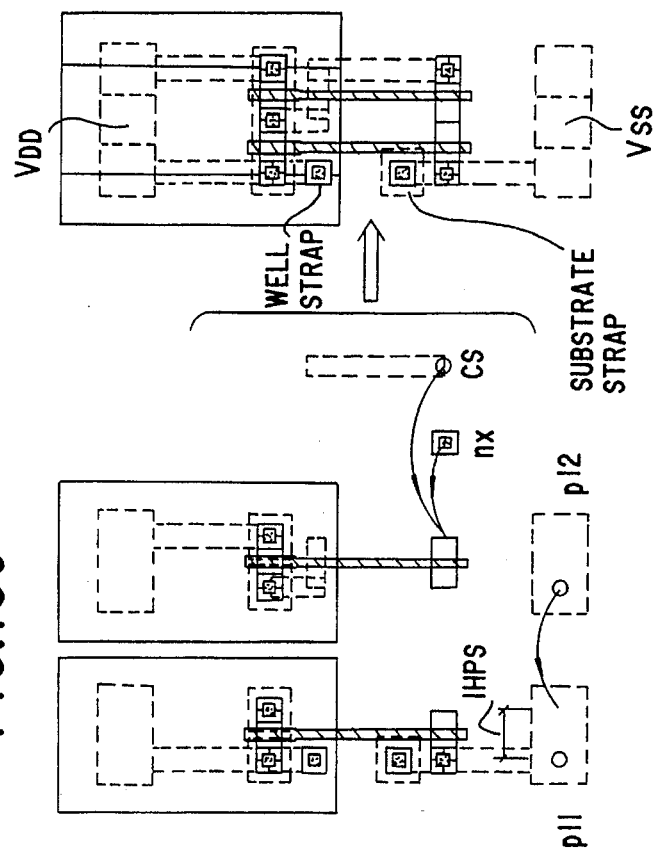
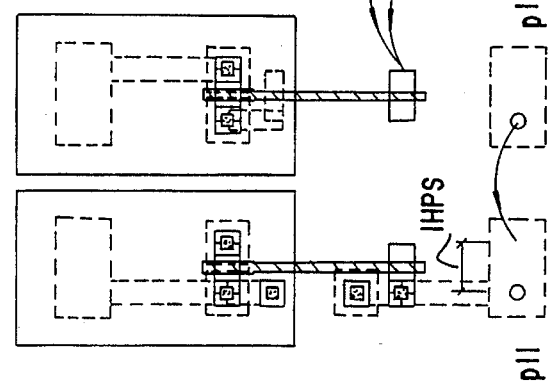
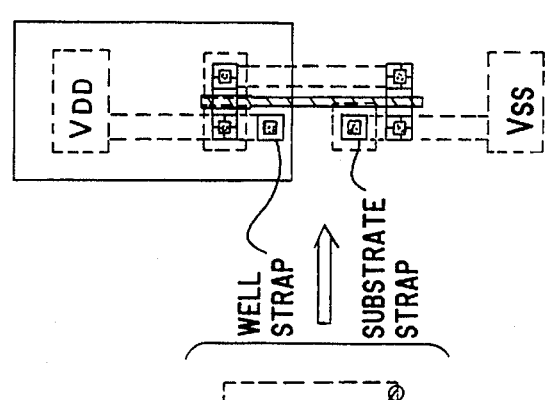
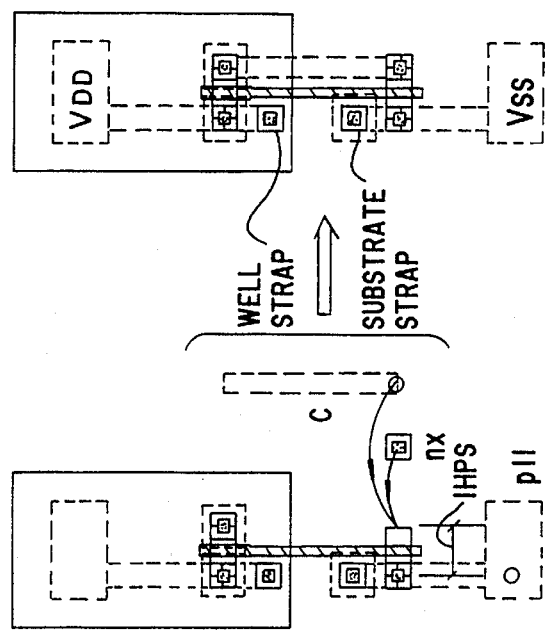

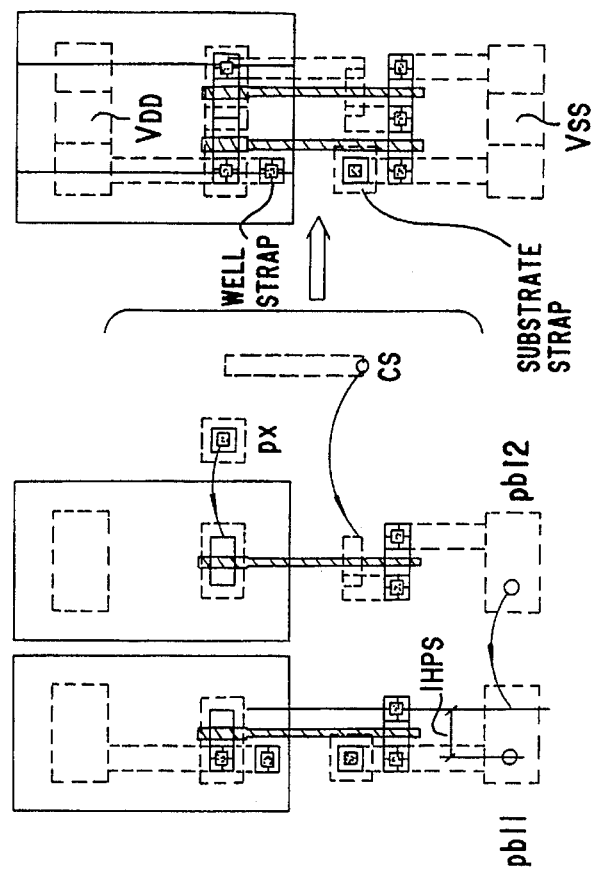

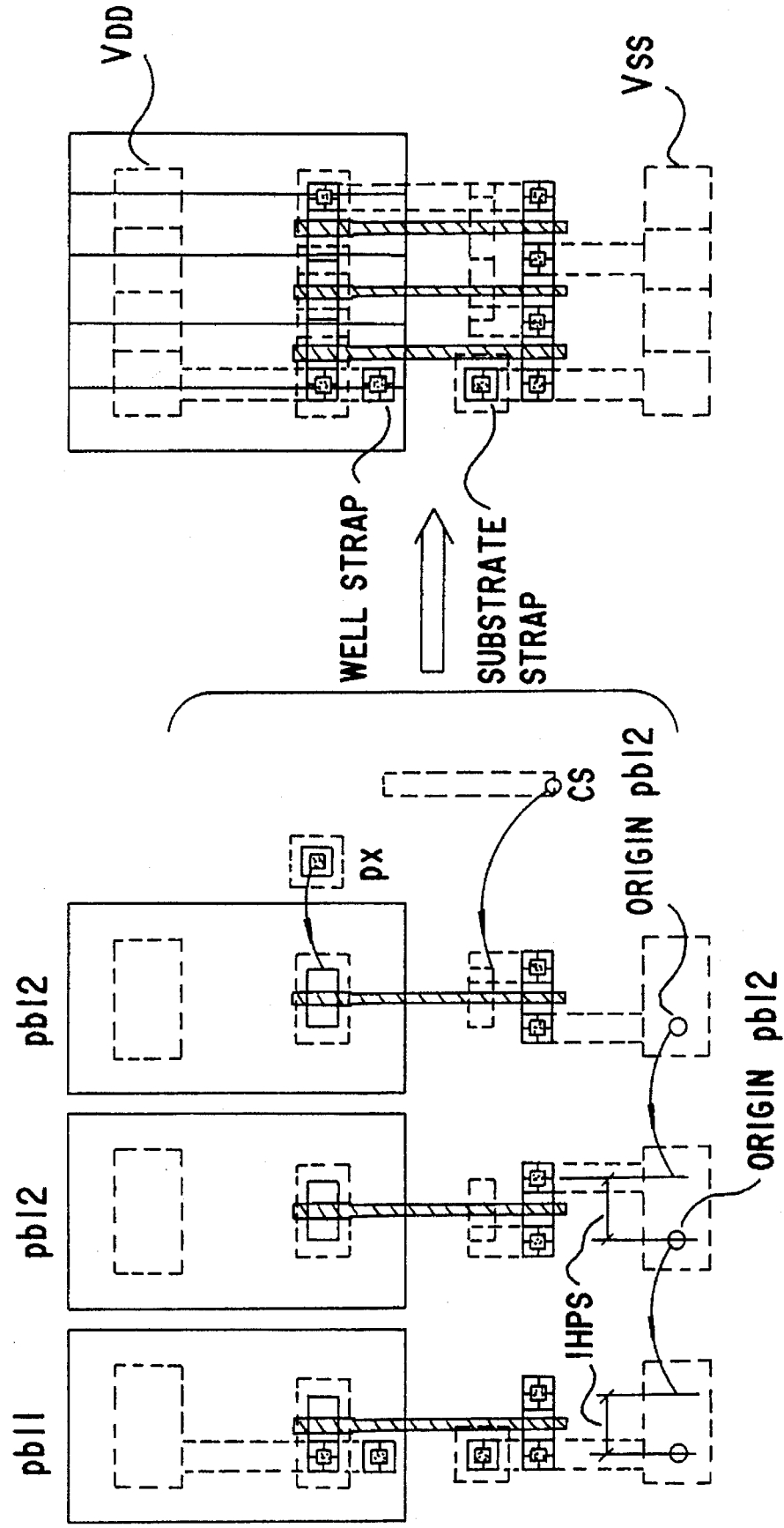

ELECTRONIC DEVICES FOR USE IN GENERATING INTEGRATED CIRCUIT STRUCTURES AND METHOD THEREFOR

This application is a continuation of application Ser. No. 08/203,223 filed Feb. 28, 1994, now abandoned, which is a continuation-in-part of application Ser. No. 08/038,120, filed Mar. 29, 1993 now abandoned.

FIELD OF THE INVENTION

The present invention relates to integrated circuit design and, in particular, to custom artwork generation based on modular cell topology. Specifically, this invention relates to electronic objects and primitives for use in generating integrated circuit structures and methods therefor, each primitive having one well of one type of semiconductor conductivity, one FET device of the same conductivity type, one other FET device of an opposite conductivity type, a doped polysilicon conductor connecting together the gates of the FET devices, a positive voltage supply, and a negative or ground voltage supply.

DESCRIPTION OF THE PRIOR ART

There are a few basic methods used today to layout very-large-scale-integration (VLSI) circuits. Manual layout by specialists has been the traditional choice for complex, high performance custom designs, but this process is very time consuming and quite error prone. Using this manual layout approach, only about 25 transistors per man day are properly laid out and verified. Such slow progress can only be justified for highly complex and performance critical circuits that have prospects of high market volume. For most other circuits, automated methods such as the standard cell or gate array (sea of gates) designs are used. To their disadvantage, automated layout methods achieve only about half the area densities of hand designs; however, automated methods tend to accomplish a circuit design at a much faster speed. Moreover, automated designs are more likely to be error free.

The standard cells that are typically manually pre-designed and automatically verified are usually general purpose structures that need to be designed only once for a particular process. In addition, they are precisely characterized and modeled to be available as library elements for automated layouts and performance simulation of any subsequent integrated circuit chip design. In the sea of gates or gate array approach, matrices of uncommitted transistors and gates are prefabricated on chips. The integrated circuit design involves final wiring operation to automatically interconnect these transistors and gates into circuit functions and, subsequently, into a completed chip. Since the location of gates and transistors is fixed in this technology, all of these gates and transistors cannot be utilized for a particular design. Therefore, the area densities for the sea of gates or gate array approach is even worse than the typical area density for the standard cell method. Since the only operation performed in the sea of gates approach is wiring, the physical design (layout) and the fabrication are much faster and cheaper, although the cost of the initial pre-processed wafer is much higher. Presently, a hybrid approach to implement VLSI chips is more common, wherein the critical circuits are handcrafted while other less critical circuits of a more regular structure such as RAMs, ROMs, PLAs, Datapaths, Multipliers, etc. are automatically generated by module generators, and still other random circuits are laid out by using standard-cell based compilers.

The methodology of this invention produces custom layouts that are equal in density to those obtained by expert hand layouts. This methodology is based on a small set of primitive objects (also called primitives), an optimized layout architecture, and a method of construction to place and route logic gates to form cells. No standard cell library is needed. The cell formation can be controlled by a circuit netlist (such as by electronic data interchange format, EDIF, an industry standard), a simplified technology file, and the environmental constraints specific to that cell. The set of primitive objects is quite generic and can be readily adapted to new process technology, making the methodology essentially technology independent. Due to a systematic architecture that is built in, the methodology can be relatively easily operated to yield instantaneous custom layouts that are dense and correct by construction.

Thus, the disclosed invention enables rapid layout of random logic circuits customized to specific performance, shape and interface requirements, while achieving area densities equal to those obtained by expert manual design. Systematic orthogonal connections in different conductor layers maintain maximum signal routing freedom in all (four) directions at all times. The resulting transparency enables relatively unrestricted over-the-cell routing, thereby enhancing overall chip density. The orthogonal crossing of conductors minimizes their areas of overlap and the crosstalk between them. At the same time the parasitic loading on the signal lines is reduced, enhancing performance. In manual custom layouts, liberty is taken to run conductor lines in any direction, which eventually blocks the active or utilized cell areas to external or global routing. Such non-orthogonal connections not only tend to block each other, but also result in larger areas of overlap among signal lines, which in turn may degrade chip performance.

The disclosed invention also incorporates a power distribution scheme that assures uniform, straight power and ground lines through butting cells. Furthermore, the substrate and well are contacted at their boundary regions to maximize circuit immunity to CMOS latch-up. Although effort is made in manual as well as automated techniques to save chip space by sharing of power, ground and active circuit nodes among adjacent structures, no formal or systematic method is followed to accomplish these goals. Thus, chip area is often wasted thereby degrading the yield and performance of an integrated circuit chip, and resulting in higher production costs.

Known layout techniques produce circuit structures either by a manual method using conductor rectangles and polygons or by an automatic method using pre-designed cell libraries. In the custom manual approach, no particular discipline is enforced, except for the process rules. Although usually compact, manual layouts are very time consuming and error prone. They are often not transparent to global routing and, in general, exhibit higher parasitic capacitive loading and coupling. The random style of manual layout makes any later changes to the design more difficult to implement. In the automatic approach, there is usually considerable area penalty. Also, cell libraries are needed which are manually designed in advance and maintained.

Therefore, a need still exists for devices that are used to rapidly generate integrated circuit structures that are effective in producing integrated circuits with optimized cell structures and interconnections for minimum overall circuit area, high performance, and reliability.

SUMMARY OF THE INVENTION

In accordance with one embodiment of this invention, it is an object of this invention to provide a device for use in generating integrated circuit structures and in a method therefor.

It is another object of this invention to provide a device for use in rapidly generating integrated circuit structures that produce integrated circuits with optimized cell structures and interconnections.

It is a further object of this invention to provide a device for use in rapidly generating integrated circuit structures that produce integrated circuits with minimum overall circuit area, high performance, and reliability.

BRIEF DESCRIPTION OF THE PREFERRED EMBODIMENTS

In accordance with one embodiment of this invention, a device for use in generating integrated circuit structures is disclosed comprising, in combination, a plurality of integrateable objects and primitives, each primitive having a well of one type semiconductor conductivity, one FET device of the opposite conductivity type located within the well, one FET device of the same conductivity type (as the well) located outside of the well, a doped polysilicon conductor connecting the gates of both FET devices, a VDD positive voltage supply line coupled to one of the FET devices, and a VSS negative voltage or ground supply line coupled to the other of the FET devices.

In accordance with another embodiment of this invention, a method of generating integrated circuit structures is provided comprising the steps of forming a plurality of integrateable objects and primitives, each primitive having a well of one type semiconductor conductivity, forming one FET device of opposite conductivity type located within the well, forming one FET device of same conductivity type located outside of the well, forming a doped polysilicon conductor connecting the gates of both FET devices, and forming a VDD positive voltage supply line coupled to one of the FET devices and a VSS negative voltage or ground supply line coupled to the other of the FET devices.

The methodology of the invention is based on a small set of primitive structures called primitives, an optimized layout architecture, and methods of formation of such primitives and of logic gates using the primitives, and methods of construction to place and route the logic gates to form cells. The cell formation is controlled by a circuit netlist, a simplified technology file of the process and the environmental and performance constraints specific to that cell.

The primitives are formed of more elementary structures herein referred to as objects, some of which are in prior art (e.g., contacts and transistors), and others which are newly developed for the methodology of the invention. Like the known objects, the set of new objects is quite generic and can be readily adapted to new-process technology, making the methodology of the invention practically technology-independent. Due to a systematic architecture that is built into it, this methodology can be relatively easily used to yield instantaneous custom layouts that are dense and correct by construction.

The foregoing and other objects, features, and advantages of the invention will be apparent from the following, more particular, description of the preferred embodiments of the invention, as illustrated in the accompanying drawings.

BRIEF DESCRIPTION OF THE DRAWINGS

FIG. 4 is a schematic top view of new objects according to this invention with illustrations of their relevant dimensions. The origin points of individual objects are also shown. An object is placed at a location by aligning its origin to that location.

FIG. 13 shows the formation procedures of an inverter, a 2-input nand gate and a 2-input nor gate from the primitives and objects of the present invention.

DESCRIPTION OF THE PREFERRED EMBODIMENT

Prior-art basic conductors as shown in FIG. 1 are used in the production of semiconductor devices and are fabricated topologically at different levels separated by layers of insulating material (e.g. glass). Such conductors are often called conductor-layers.

Although the methodology of this invention is equally applicable for a p-well process, the following description only relates to n-well processes for illustration, inasmuch as the former would be easily understood by those skilled in the art.

Referring to FIG. 1, some representations of basic conductor layers of the prior art are shown, as described below.

Figure 1A:
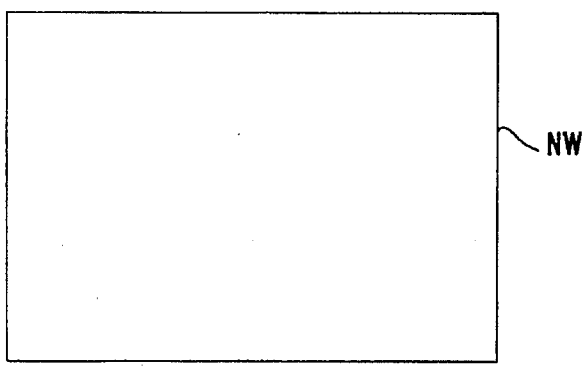
FIG. 1 is a top schematic view of a representation of prior art basic conductor layers.

FIG. 1a shows a segment of an n-well region, herein defined as NW. It consists of a lightly doped N-type region serving as substrate for P-type transistors.

Figure 1B:
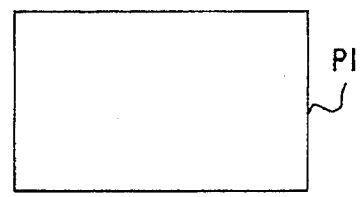

FIG. 1b is a segment of p-implant (PI), the positive doping. Areas of opposite doping, n-implant (NI), are not shown but are assumed generated by computer, as is commonly done in the industry.

Figure 1C:

FIG. 1c is a segment of mask geometry, called Active area, AC.

Such area is doped P-type or N-type, depending on whether or not it is overlapped by PI. A p-doped AC area is called p-diffusion (PD) and an n-doped AC area is called n-diffusion (ND). Therefore, the geometry of FIG. 1c is an n-diffusion segment.

Figure 1D:

FIG. 1d shows a doped polysilicon (or poly) segment (PL).

Figure 1E:
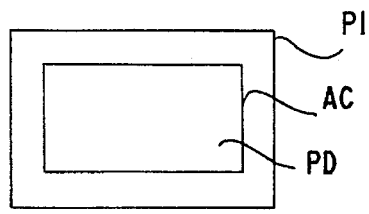

FIG. 1e shows a p-diffusion segment (an AC overlapped by PI).

Figure 1F:
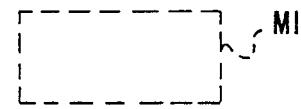

FIG. 1f shows a metal1 segment (M1), a first layer metal, which typically consists of aluminum.

Figure 1H:
Figure 1I:
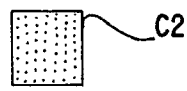
Figure 1G:

FIG. 1g shows a metal1 segment (M2), a second layer metal, which also typically consists of aluminum.

FIG. 1h is a top view of a contact geometry (C1), that is, a vertical hole through the insulating oxide to connect a PL, ND or PD and an M1 conductor.

FIG. 1i is a top view of a "via" geometry (C2), that is, a vertical hole through oxide to connect M1 and M2 conductors.

Referring now to FIG. 2, prior-art structures made of combinations of elementary conductor-layers are also illustrated. Such simple composite structures are herein called objects.

Figure 2A:
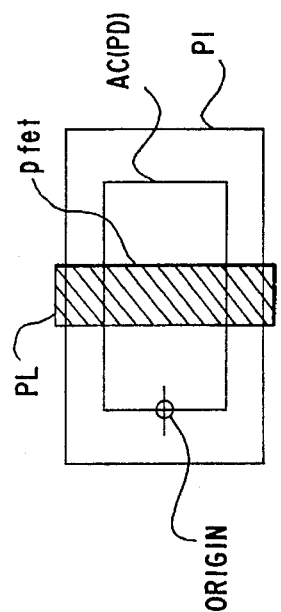
FIG. 2 is a schematic top view of a representation of prior art basic set of objects.

FIG. 2a shows an object defining a P-type transistor, pfet. Its transistor channel is formed by the intersection of a PL and a PD layer elements.

Figure 2B:
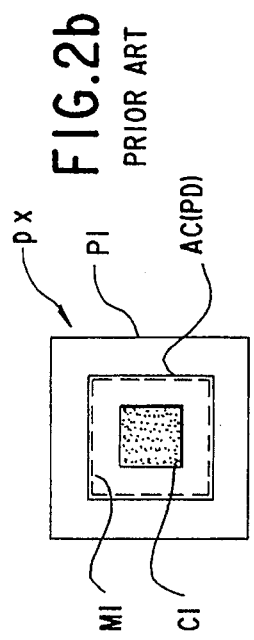

FIG. 2b shows a metal1 to p-diffusion contact, px. It consists of a layer medium C1 overlapped by both an M1 and a PD segments.

Figure 2C:
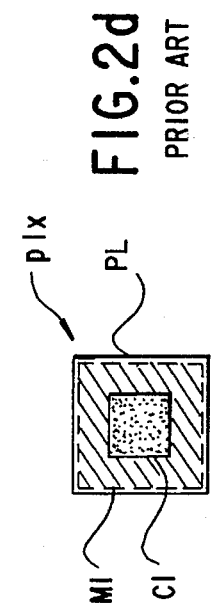

FIG. 2c shows an N-type transistor, nfet. Its transistor channel is formed by the intersection of a PL and an ND elements.

Figure 2E:
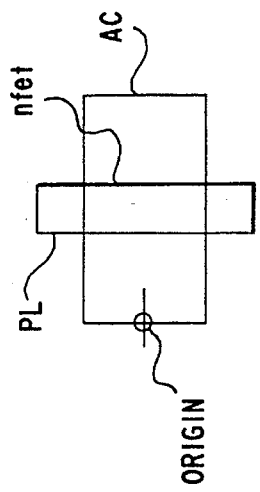
Figure 2D:
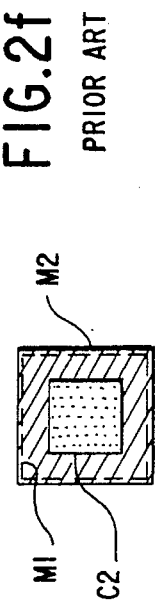

FIG. 2d shows a metal1 to poly contact, plx. It consists of a layer medium C1 overlapped by both an M1 and a PL elements.

FIG. 2e shows a metal1 to n-diffusion contact, nx. It consists of a layer medium C1 overlapped by both an M1 and an ND segments.

Figure 2F:
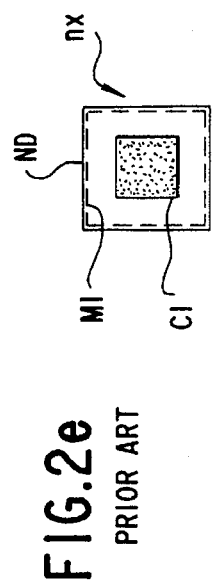

FIG. 2f shows a metal1 to metal2 contact, mx. It consists of a layer medium C2 overlapped by both an M1 and an ND segments.

Note that for the objects px, nx, plx and mx shown in FIG. 2, the M1 overlap of C1 or C2 is shown as slightly smaller than that of the other layers for visual differentiation only. In practice, it is quite often the same as for the other layers, ND, PD, PL and M2. Accordingly, throughout the following description it is assumed to be the same for simplicity.

For the purposes of this invention, conductor-layer elements and object structures, such as illustrated in FIGS. 1 and 2, are further described in terms their width and length, and of their mutual overlaps and spacings. Moreover, each element (and each composite structure) is assigned an origin point to facilitate its placement at a location.

The following naming convention for dimensional parameters is defined for use in this disclosure.

Naming convention for dimensional parameters.

Conductor-layer elements are usually configured as rectangles and described in terms of their material and their width and length dimensions, W and L, in microns (μm). Accordingly, for example, the dimensions of a conductor segment named x, which is 10 micron long and 2 micron wide and is of the layer type metal1, is described as:

Wx(M1)=2 μm

Lx(M1)=10 μm

Of special significance are the minimum permissible dimensions for and between conductor layers, which are governed and set by the layout design rules of the particular fabrication process. To maximize area density of circuits, many of such minimum dimensions are commonly used in the design of segment geometries. In this description, a minimum dimension is labeled by affixing a "0" to the dimensional symbol, such as W0(M1). This is the minimum width any M1 segment may have according to the particular process being used.

Since an object is formed by a group of two or more basic layer elements, all such layers are included in the parenthetical portion of the dimension symbol for such object. For example, according to this description the width of a metal1 to n-diffusion contact nx is denoted by Wnx(M1,C1,ND).

Similar conventions are used to describe inter-conductor spacings and overlaps. By denoting the conductor spacing by S and the conductor overlap by O, a minimum process-specified metal1-to-metal1 spacing of 2 micron is expressed as:

S0(M1)=2 μm; and a minimum 0.8-μm metal1 overlap of contact is expressed as:

O0(M1,C1)=0.8 μm.

Lower case letters are used to describe variable width and length dimensions of conductors. For example:

l(M1)= variable length of metal1 in μm (or units of HPS, as detailed below);

w(M1)=variable width of metal1 in microns; etc.

The origin point of a structure is indicated by a small circle with a cross-point at its center, placed at a designated location on the structure, as indicated by Origin in FIGS. 2a and 2c.

Figures 3, 8:
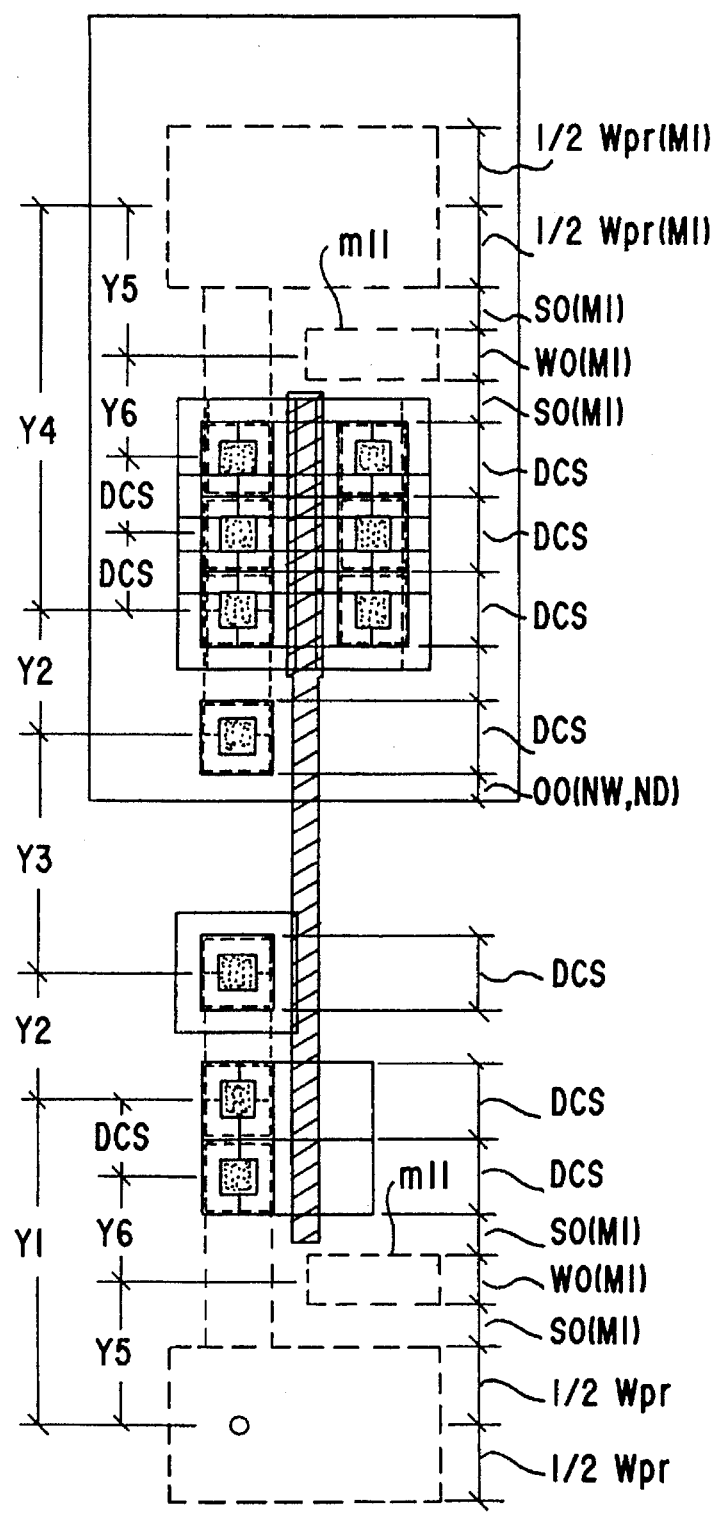
FIG. 3 is a schematic top view of prior art basic objects illustrating some of their relevant dimensions.
FIGS. 8.1, 8.2 and 8.3 are schematic top views of the primitives of FIGS. 6 and 7 used to define and illustrate key dimensional parameters underlying the construction of these primitives, and to illustrate the methodology of this invention in general. The origin of each primitive is also shown.

Following the convention detailed above, the prior-art objects of FIG. 2, with illustrations of some of their pertinent dimensions, are shown in FIG. 3. The following dimensions are further defined for the purposes of this disclosure.

| Symbol | Description |
| --- | --- |
| L | Length, transistor channel |
| W | Width, transistor channel |
| O(AC, PI) | Overlap of active area by p-implant |
| O(C1, M1) | Overlap of contact by metal1 |
| O(C1, PL) | Overlap of contact by poly |
| O(C1, ND) | Overlap of contact by n-diffusion |
| O(C2, M1) | Overlap of via (C2) by metal1 |
| O(C2, M2) | Overlap of via (C2) by metal2 |
| DCS | Diffusion contact space. This is also the width of a unit pfet or a unit nfet. |
| PLCS | Poly contact space |
| MCS | Metal contact space |
| | DCS, PLCS and MCS are further quantitatively defined as follows: |
| DCS | Space occupied by a metal1/diffusion contact, nx or px. DCS = W0(C1) + 2 O(C1, M1). |
| PLCS | Space occupied by a metal1/poly contact, plx. PLCS = W0(C1) + 2 O(C1, PL). |
| MCS | Space occupied by a metal1/metal2 contact, mx. MCS = W0(C2) + 2 O(C2, M1 (or M2)). |
| HPS | Horizontal pitch space to place a FET. The space between two adjacent unrelated FETs is the same. HPS = DCS + 2 S0(ND (or PD), PL) + W0(PL). |

Occasionally, for a given process, the minimum transistor channel length is larger than W0(PL). In that case, this larger value is used in the above expression defining HPS.

In the prior art there is no standard location for origin points of objects. In the methodology of this invention, the origin of each object, prior or new, is set at some predetermined specific location. For example, the origin point of each contact structure (nx, px, plx and mx) is set at its center. The origin point of a unit FET (pfet or nfet) is set at the intersection of its AC segment's left edge and the line bisecting it.

Referring to FIG. 4, a set of new objects is shown in terms of some of the basic layers and the prior-art objects of FIG. 2. These new objects are developed for the methodology of the present invention. Their width and length dimensions are process related and are, therefore, fixed for a process. The figure shows also the origin point of each object, marked by a cross point enclosed by a small circle on each object. An object is placed at a point by aligning its origin to that point. The origins of objects ax and axx are situated at their respective "px" centers.

Figure 5B:
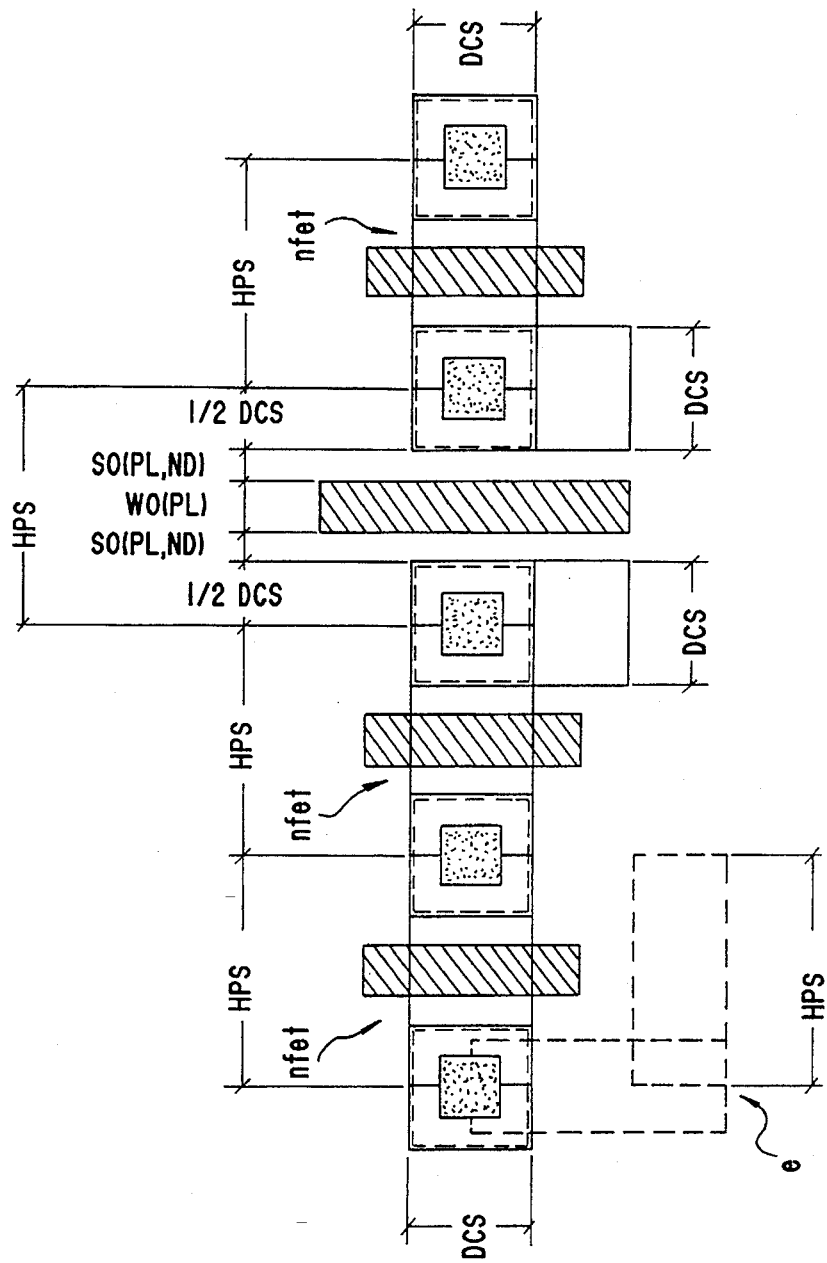
FIG. 5 is an expanded view of a representation of FET locations according to the methodology of the invention and an illustration of some related dimensional parameters.
Figure 5A:
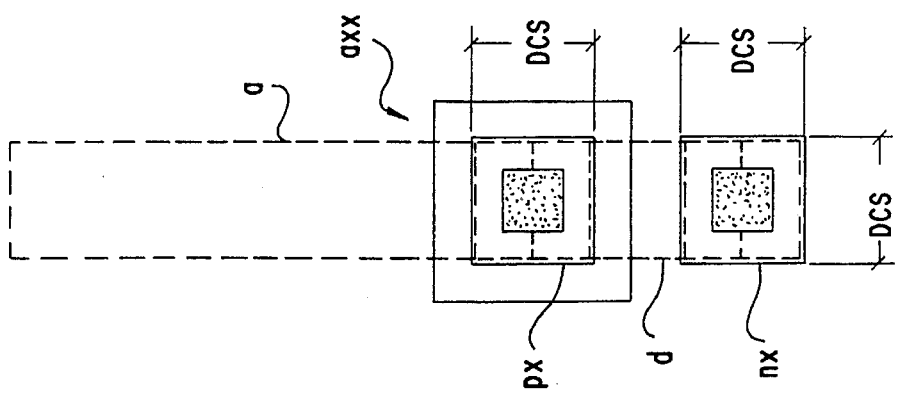

A description of the new objects illustrated in FIG. 5 is given below:

"pr" is a horizontal segment, M1. This segment is designed as a link of the horizontal power rails (VDD and VSS) through a row of gates;

"a" is a vertical segment, M1;

"ax" is a grouping of a and px;

"axx" is a grouping of ax, d, and nx;

"d" is a vertical segment, M1, connecting px and nx in objects axx and bxx;

"m11" is a horizontal segment, M1;

"m12" is a vertical segment, M1;

"e" is an L-shaped geometry formed by grouping m11 and m12;

"b" is a vertical segment, M1;

"bx" is a grouping of b and nx;

"bxx" is a grouping of bx, d, and px;

"c" is a vertical segment, M1, used to connect complementary sections of an inverter;

"cs" is a vertical segment, M1, used to connect complementary sides of gates (other than the inverter, for which c is used); cs is shorter than c;

"pl1" is a vertical segment, PL, used to connect gate terminals of complementary FETs together;

"as" is a vertical short, skinny segment, M1; and

"nw1" is a vertical n-well box, NW.

Each of the above new objects is further defined in terms of its width and length dimensions, and location of its origin relative its geometry, as follows:

Process-related dimensions of objects according to the invention.

Dimensions of Object "pr":

The value Wpr(M1) is calculated from statistical considerations of the expected maximum rms current density in the power rails at the maximum operational clock frequency of circuits for the process in which they are fabricated, and when the rails are strapped every so often to the main supply lines running vertically in metal2, so that the worst case resistive voltage drop along these rails does not exceed a set value (about 50 milli-Volt), and the maximum permissible current density to avoid electro migration in metal1 (~0.5 milli-Ampere per micron line width) is not exceeded. Note that the criteria for choosing Wpr(M1) are prior-art knowledge. Based on these considerations, for a 1-μm process with clock rates of 40 MHz and a strapping distance of 1000 μm, a Wpr(M1) of about 5 μm was calculated.

The length of "pr" is defined as follows:

$$Lpr(M1)=2(DCS+2S0(PL,ND(\text{or } PD))+W0(PL)).$$

As defined above, the expression in parenthesis on the right-hand side of this equation is the Horizontal Pitch Space, HPS:

$$HPS=DCS+2S0(PL,ND(\text{or } PD))+W0(PL).$$

In some processes, the minimum transistor channel length is larger than the minimum feature size of polysilicon conductor, W0(PL). In such cases this larger value is used in the above expression. Note that this definition, although derived for this invention, has general application to any process.

The dimension HPS is illustrated in FIG. 5. It is the horizontal pitch at which adjacent transistors with a common diffusion contact are placed in a circuit. In the methodology of the invention an HPS is the standard pitch for all transistors sharing a diffusion node. The space between two adjacent unrelated transistor nodes with diffusion contacts also amounts to one HPS, as shown in FIG. 5. This permits placing a poly conductor through that space for connections to and from gates without any additional area usage. Thus, HPS is a useful and universal kind of quantity that can be readily calculated for any process.

It is noticed from FIG. 4 that the origin points of most objects are located at one of their edges and one of their symmetry axes, which makes placing of objects at a given location quite convenient. Exceptions are the origins for the objects pr, b, pl1 and nw1.

The dimensions and origin points of these new objects are therefore defined as follows. For object "pr," as detailed above:

$$Lpr(M1)=2 \text{ HPS}$$

The "pr" origin is situated at ½ HPS from its left edge on the line bisecting its width, as shown in FIG. 4a.

For object "m12":

$Wm12(M1)=W0(M1)$; and $Lm12(M1)=DCS+S0(D,T)+0.5\ W0(M1)$.

Due to current density considerations, the smallest metal1 line width is often standardized at a slightly larger value than the $W0(M1)$ for a process. In that case, this larger value for $W0(M1)$ is implied in the above expression; in addition, the origin of "m12" is located at midpoint of its bottom edge.

For object "m11":

$Wm11(M1)=W0(M1)$; and $Lm11(M1)=1\ HPS$.

The origin of "m11" is located at midpoint of its left edge, as shown in FIG. 4f.

For objects "a" and "b":

$Wa(M1)=W0(C1)+2\ O0(M1,C1)$

The length of object "a" will vary depending on the desired maximum width of an individual PMOS transistor section or "finger," as it is sometimes called. In the methodology of the invention, this maximum width is considered to consist of integral multiples only of a diffusion contact on the source node of any PMOS transistor. It is noted that, if this source node is connected to the power rail (pr), more diffusion contacts can be placed on it than on the drain side of the transistor. In this description it is assumed that two more contacts can be placed on the source of such transistor than on its drain. Assuming further that the maximum number of diffusion contacts on a PMOS drain is n, the dimension $La(M1)$ is defined as:

$La(M1)=(2n-1)/2\ DCS+S0(M1)$;

or, if we set n=4, $La(M1)=3.5\ DCS+S0(M1)$.

In practice, often the transistor width is less than its maximum, so that the freed-up contact space closest to the power rail pr can be used for some local metal1 connections. Such connections are usually not necessary for the construction or wiring of ordinary logic gates, but are frequently needed in the construction of complex gates, as will be seen later. It is thus useful to expand the nearest-to-power rail drain contact space, DCS, to an unrelated metal1 line space $W0(M1)$, which is only slightly larger than the former (see also FIGS. 8.3 and 9). For a 1 μm process, replacing a DCS by a $W0(M1)$ required expanding this space by only 0.4 microns. Accordingly, the expression for $La(M1)$ becomes:

$La(M1)=(2n-3)/2\ DSC+W0(M1)+2\ S0(M1)$;

or, for n=4, $La(M1)=2.5\ DSC+W0(M1)+2\ S0(M1)$.

The origin of object "a" is located at midpoint of its bottom edge, as shown in FIG. 4.

Considerations similar to the ones just discussed for object "a" apply to object "b" as well. Assuming that the maximum number of contacts on an NMOS drain is 3, then:

$Lb(M1)=2.5\ DCS+S0(M1)$;

or, expanding the third DSC to an unrelated metal1 line space, this expression becomes:

$Lb(M1)=1.5\ DSC+W0(M1)+2\ S0(M1)$;

and $Wb(M1)=Wa(M1)$, as defined above.

The origin of "b" is situated at a distance $S0(M1)+\frac{1}{2}W0(M1)$ from its bottom edge on a line bisecting its width, as shown in FIG. 4i.

Note that the transistor sizes in practice can be conveniently varied in steps of a diffusion contact space, DSC. The width of a transistor (PMOS or NMOS) can be stretched as a maximum up to the outer edge of the respective power rail, VDD or VSS. A transistor size larger than that, such as the one for a high drive buffer, is split into multiple sections (or "fingers") that are connected in parallel to yield an aggregate transistor width that equals the one required.

For object "d":

$Wd(M1)=Wa(M1)=Wb(M1)$, and $Ld(M1)=DCS+S0(D,ST)$.

The origin of "d" is located at the middle of its bottom edge, as shown in FIG. 4o.

For objects "c" and "cs":

$Wc(M1)=W0(M1)$;

$Lc(M1)=2(Ld(M1)+S0(M1))+$ the larger of PLCS or MCS;

$Wcs(M1)=Wc(M1)=W0(M1)$;

and $Lcs(M1)=Lc(M1)-Lm12(M1)+W0(M1)$.

These objects are used to connect the NMOS and PMOS sides of the output node of a gate. The object "cs" is used for all gates except inverters, in which case "c" is used.

The origins of objects "c" and "cs" are located at the middle of their respective edges, as shown in FIGS. 4l and 4m.

For object "pl1":

$Wpl1(PL)=W0(PL)$;

and $Lpl1(PL)=Lc(M1)-DCS-2$ (minimum gate poly extension beyond a transistor channel).

This element is used to connect gate-poly conductors of complementary PMOS/NMOS transistors corresponding to a gate input, which are vertically aligned to each other in the methodology of the invention.

The gate-poly extension beyond transistor channel is illustrated in FIG. 3. Its minimum value is determined by the design rules of a process.

The origin of "pl1" is situated at a distance Y2−(½ DCS +Poly extension beyond MOS channel) on a line bisecting its width, as seen in FIG. 4n.

For object "as":

$Was(M1)=W0(M1)$;

and $Las(M1)=0.5\ DCS+S0(M1)+W0(M1)$.

The origin of "as" is situated at the middle of its bottom edge, as shown in FIG. 4p.

For object "nw1":

$Wnw1(NW)=HPS+DCS+2\ OO(NW,PD)$.

Lnw1(NW) will depend, among others, on the maximum number of diffusion contacts that can be placed on the source node of a PMOS transistor. According to the above discussion, this number was set at 6 for this description. Thus, $Lnw1(NW)=6\ DCS+Ld(M1)+OO(NW,PD)+OO(NW,\ NW\text{-}TIE)$.

Figure 6A:
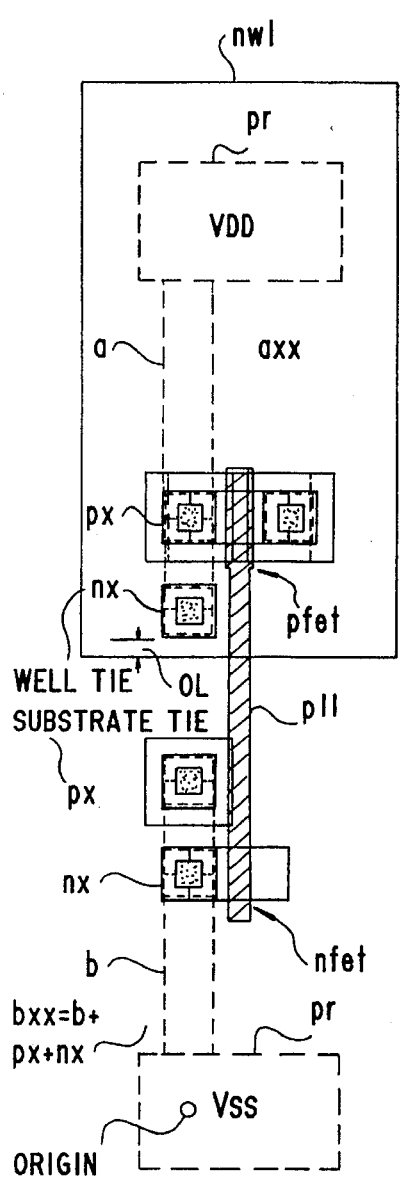
FIG. 6 is a schematic top view of new primitives according to the invention which are used to construct ordinary, single-level logic gates. Basic prior-art and new objects are used in combination to form these primitives.
Figure 6B:
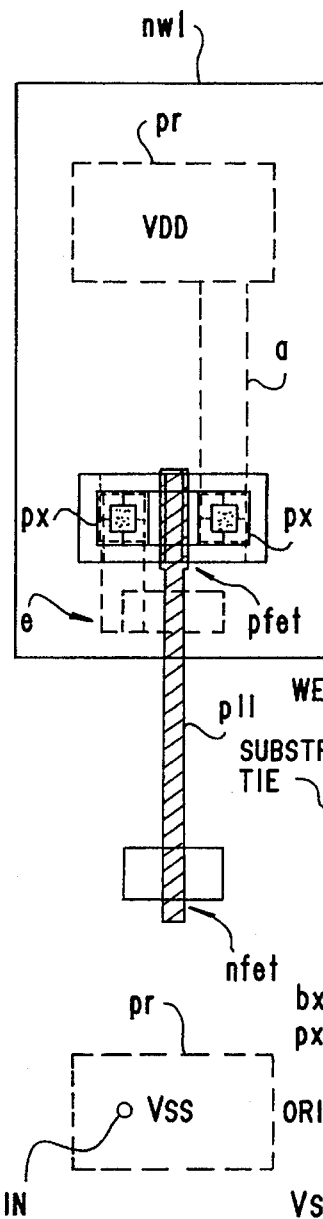
Figure 6C:
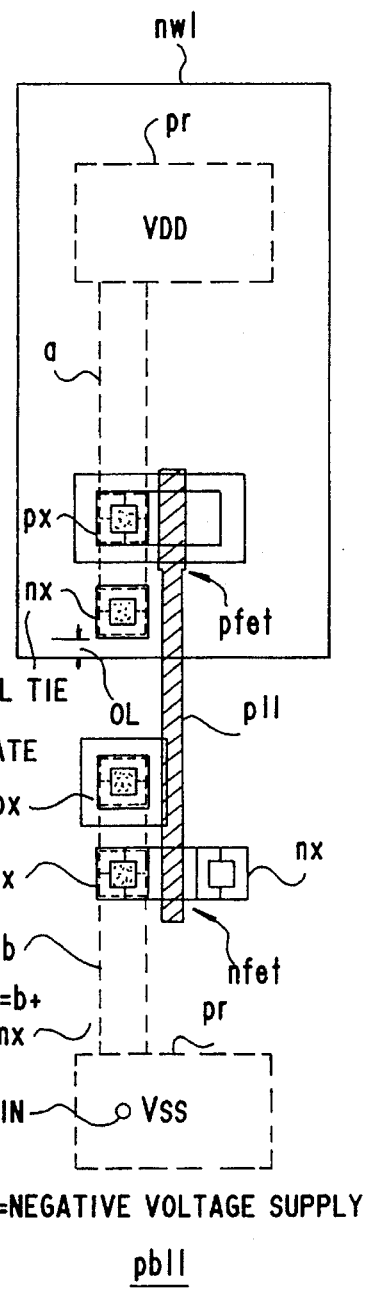

The last term is the minimum overlap of N-well over a well tie, which is illustrated in FIG. 6 as OL for primitives p11 and pb11.

The origin of "nw1" is situated at a distance OO(NW,PD) +½ DCS) from its left edge, and a distance ½ DCS + OO(NW, NW-TIE) from its bottom edge.

The set of new objects described and parameterized above can be tabulated alongwith those of the prior art and their dimensions calculated readily from process design rules to quickly adapt these objects to a new process.

Referring to FIG. 6, a group of new structures, called primitives for the purposes of this disclosure, is defined. A primitive according to this invention is a general purpose, subgate level, structure which is designed to implement geometries corresponding to a single gate input. It also links the VDD and VSS lines between neighboring structures to assure continuity of these lines through a row of gates. Before defining these primitives, additional conventions regarding the physical orientation of structures are necessary, as follows.

A structure may be used within another, higher level, structure in its normal orientation, as originally shown, or mirrored in the x or y directions. The mirrored-in-x orientation of a structure is denoted by a horizontal bar (-) above its name (for example, ē), while its mirrored-in-y orientation is denoted by a vertical bar (|) to the right of its name (i.e., e|). In certain cases, it is necessary to use the structure rotated by a 180-degree angle. Such rotation is represented by an arc (⌣) above the structure name (i.e., ȇ ).

If an object is used at more than one location in a structure, its name may appear only once in its definition matrix with each location written in individual parenthesis separated by commas (i.e., nx(2,2),(3,2), . . . ). This convention is used for example in the formation of matrices for primitives described below.

According to these rules, the primitives shown in FIG. 6 are defined as follows:

"f" is a grouping of 2 pr, pfet, nw1, nfet, pl1. "f" is a fet-pair with a common gate poly;

"p11" is a grouping of f, axx, bxx, px;

"p12" is a grouping of f, e, px, ax;

"pb11" is a grouping of f, axx, bxx, nx; and

"pb12" is a grouping of f, e|, nx, bx.

The above primitives are typically used to form all gates of single-level logic and can also be used to form terms of two-level logic gates that are connected to the VDD and VSS on one side. This is illustrated in the description of complex gate formation given below. The primitives p11 and p12 are used to form all "nand" type gates while pb11 and pb12 are used to construct all "nor" type gates. Inverters can be formed by either the p11 or the pb11 primitives. The formation matrices of these primitives are given below.

Formation matrices for primitives p11, p12, pb11, pb12, p21, p22, pb21, pb22 (see also FIGS. 4, 6, 7, 9 and 10):

| Structure used | Location (h, v) |  | Structure used | Location (h, v) |  |
|---|---|---|---|---|---|
| f | (0, 0) |  | f | (0, 0) |  |
| axx | (0, 8) | p11 | e | (0, 8) | p12 |
| px | (2, 8) |  | ax | (2, 8) |  |
| bxx | (0, 1) |  | px | (0, 8) |  |
| f | (0, 0) |  | f | (0, 0) |  |
| axx | (0, 8) | pb11 | e| | (0, 3) | pb12 |
| bxx | (0, 1) |  | bx | (2, 1) |  |
| nx | (2, 3) |  | nx | (0, 3) |  |
| f | (0, 0) |  | f | (0, 0) |  |
| as | (0, 10) |  | as | (2, 10) |  |
| px | (0, 10), (2, 10) |  | px | (0, 10), (2, 10) |  |
| px | (0, 9), (2, 9) |  | px | (0, 9), (2, 9) |  |
| px | (0, 8), (2, 8) | p21 | px | (0, 8), (2, 8) | p22 |
| pfet | (0, 10), (0, 9) |  | pfet | (0, 10), (0, 9) |  |
| nx | (0, 2) |  | m12l | (0, 8) |  |
| nfet | (0, 2) |  | nfet | (0, 2) |  |
| bx | (0, 1) |  |  |  |  |
| f | (0, 0) |  | f | (0, 0) |  |
| ax | (0, 8) |  | pfet | (0, 10), (0, 9) |  |
| px | (0, 9), (0, 10) |  | m12 | (0, 3) |  |
| pfet | (0, 10), (0, 9) | pb21 | nx | (0, 3), (2, 3) | pb22 |
| nx | (0, 3), (2, 3) |  | nx | (0, 2), (2, 2) |  |
| nx | (0, 2), (2, 2) |  | as| | (2, 2) |  |
| nfet | (0, 2) |  | nfet | (0, 2) |  |
| as| | (0, 2) |  |  |  |  |

Figure 7A:
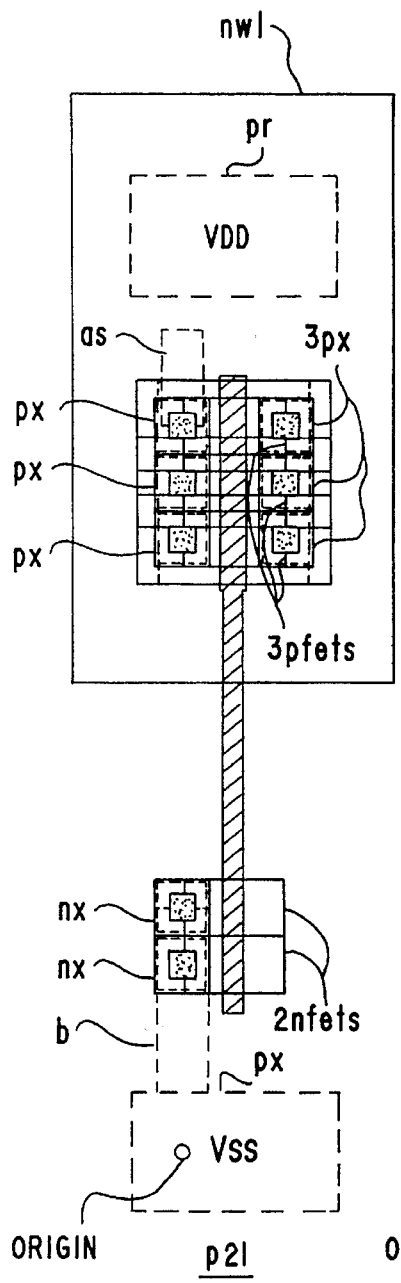
FIG. 7 is a schematic top view of new primitives which, in conjunction with the primitives in FIG. 6, are used to construct complex, double-level logic gates. Basic prior-art and new objects are also shown combined to form these primitives.
Figure 7B:
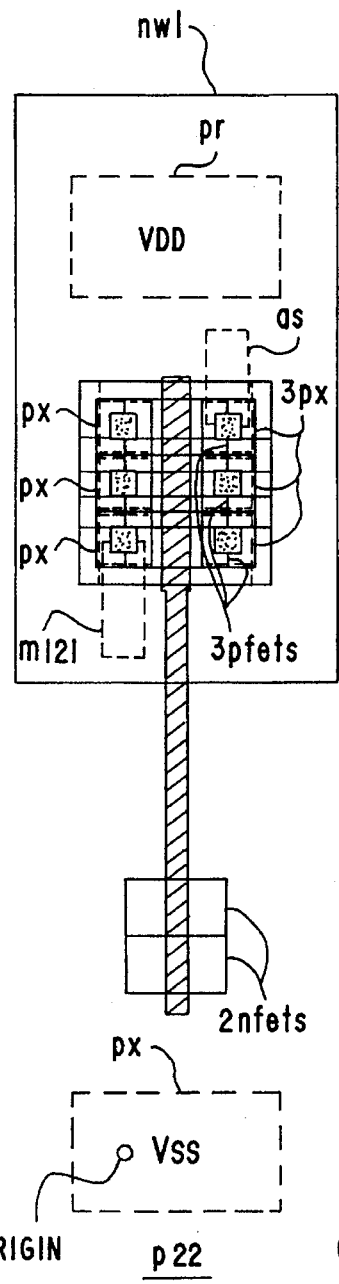
Figure 7C:
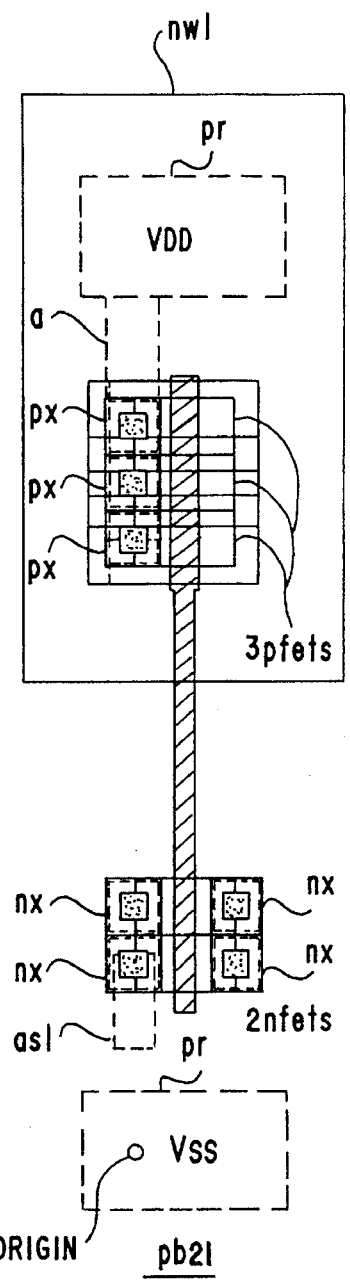

Referring to FIG. 7, the above primitives are slightly modified to yield complex-gate primitives p21, p22, pb21 and pb22. A unit transfer gate "ft" is also shown. These structures are defined as follows:

"p21" is a grouping of f, 2 pfet, 6 px, as, nfet, nx, bx;

"p22" is a grouping of f, 2 pfet, 6 px, as, as|, nfet;

"pb21" is a grouping of f, ax, 2 pfet, 2 px, nfet, 4 nx, as|;

"pb22" is a grouping of f, 2 pfet, nfet, 4 nx, as, as|; and

"ft" is a grouping of 2 pr, pfet, 2 px, nfet, 2 nx, 2 c; "ft" is a unit transfer gate structure.

The primitives p21, p22, pb21 and pb22 are used to form all complex gates in the two-level logic. For instance, p21 and p22 are used for all "and-or-invert" type structures, while pb21 and pb22 are used for all "or-and-invert" type structures. The formation procedure of complex gates is given below.

Referring to FIGS. 8.1, 8.2 and 8.3, some basic, process-dependent dimensions are shown that control construction of the new objects and primitives, and of logic gates. FIGS. 8.1 and 8.2 show the dimensions Y1 to Y4, while the dimensions Y5 and Y6 are shown in FIG. 8.3. These dimensions are defined as follows for the purposes of the invention:

Y1=½ Wpr(M1);
Y2=Ld(M1);
Y3=PLCS (or MCS, if larger)+DCS+2 S0(M1);
Y4= La(M1)+½ Wpr(M1);
Y5= ½ Wpr(M1)+S0(M1)+½ W0(M1); and
Y6= ½ W0(M1)+S0(M1)+½ DCS.

Figure 9:
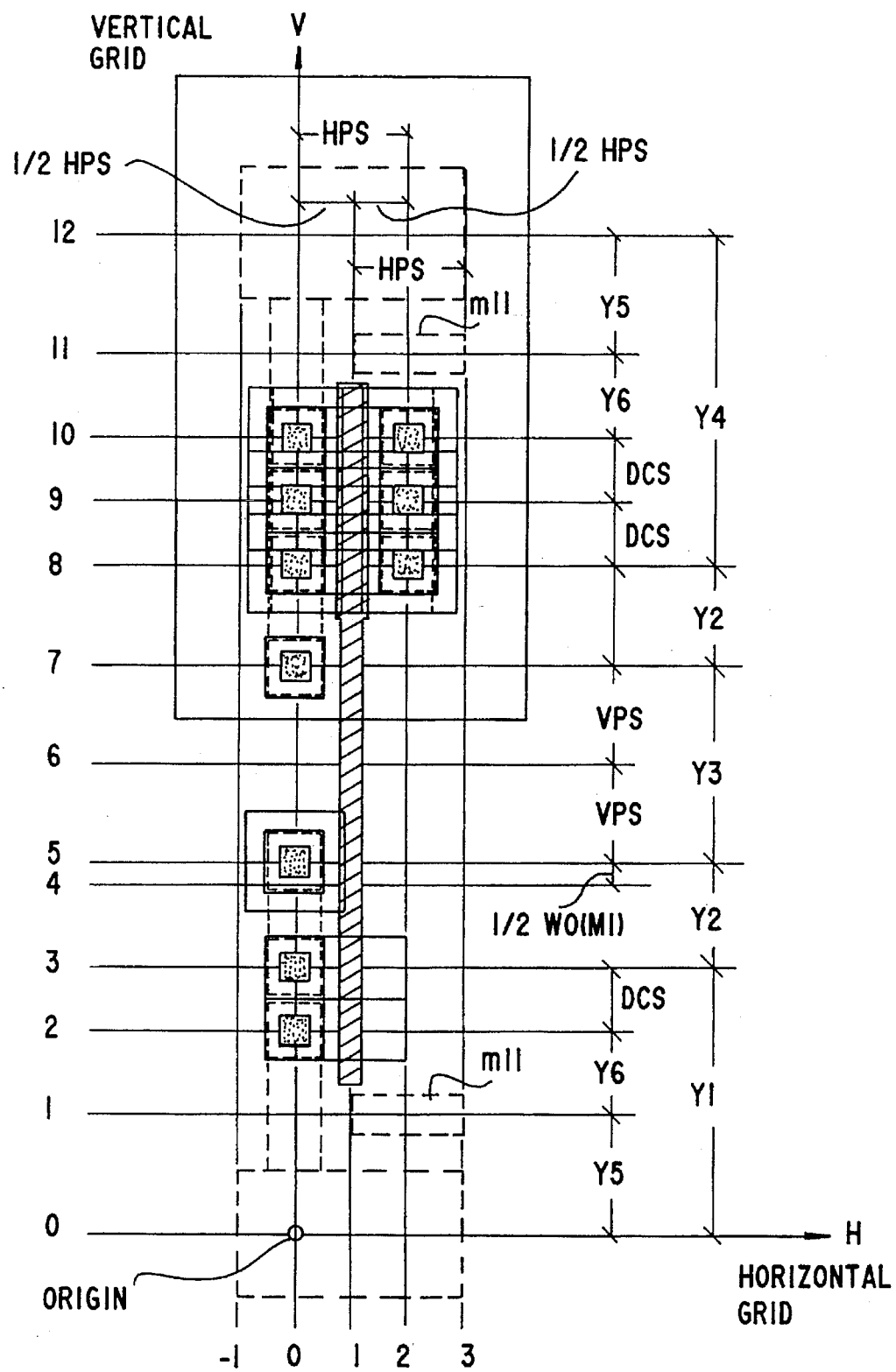
FIG. 9 is a schematic top view showing a developed grid system relative to a primitive. The primitive shown is p11 with the addition of 3 FETs (1 nfet and 2 pfets), corresponding diffusion contacts, and 2 metal1 line objects m11. The horizontal grid size "H" is shown in steps of ½ HPS. The quantity HPS is defined in FIG. 5. The vertical grid, V, as shown, is not uniformly sized but is found to be practical and generally suited for constructing primitives and logic gates and, in many instances, for locating the input/output connections of gates. Finally, the quantity VPS, Vertical Pitch Space, is also shown in this figure.

Referring to FIG. 9, a generic grid system is shown and parameterized in terms of the process dimensions. Structures are placed on this grid to assure topological correctness of the layout. A grid system is shown and quantified in terms of these dimensions (Y1 to Y6) and the previously defined dimension HPS. Y1 to Y6 define the grid in the vertical direction and HPS defines it in the horizontal direction. An additional dimension, VPS, the vertical pitch space, is also introduced and shown in FIG. 9. VPS is defined as:

*VPS=2 S0(M1)+DCS+the larger of PLCS or MCS.*

VPS is the general pitch at which horizontal metal1 lines are placed for circuit interconnections. Most of such metal1 interconnections are above the VDD line or below the VSS line (not shown). Such areas between the rows of gates are called the wiring channels. The vertical direction of the grid of the invention is named V and the horizontal direction is named H. For the formation of primitives and gates, twelve distinct vertical grid points are identified and defined, while the horizontal grid has only a uniform size of ½ HPS, as shown. For circuit interconnections, however, a finer grid size such as ¼ HPS or lower is necessary. As mentioned, by placing the primitive structures on this grid, topological correctness of layout is assured.

Figure 10:
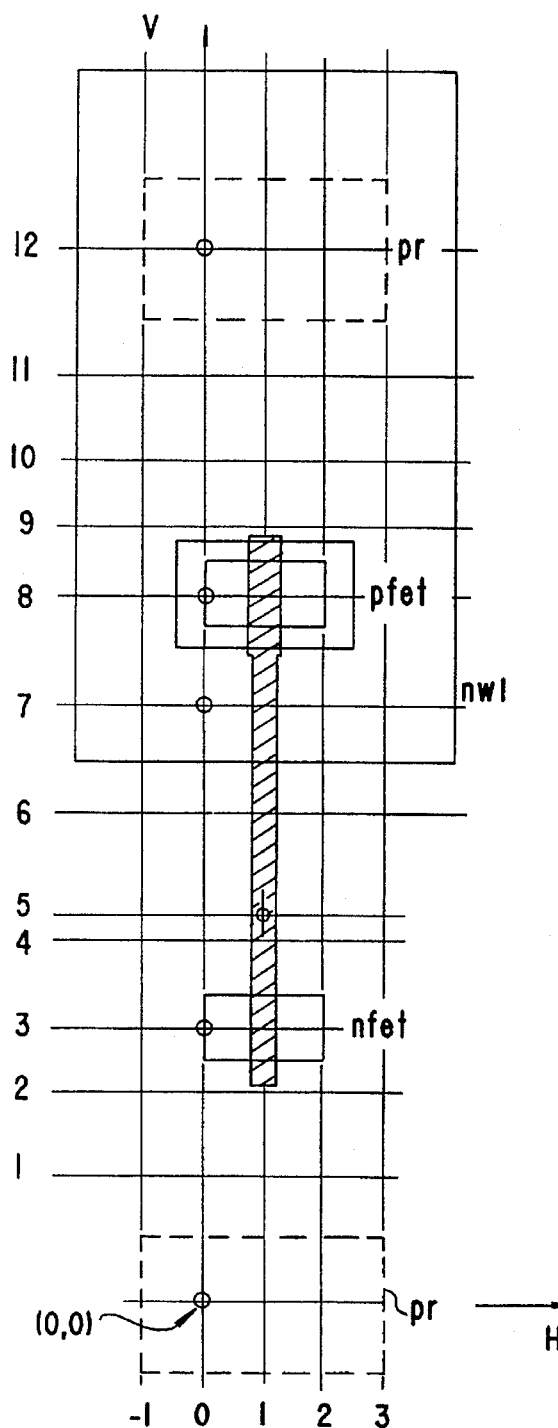
FIG. 10 shows a schematic top view of the primitive "f" placed in relation to the grid of the invention. This primitive is used to define most other primitives. The formation matrix of "f" is also given.
Figure 11:
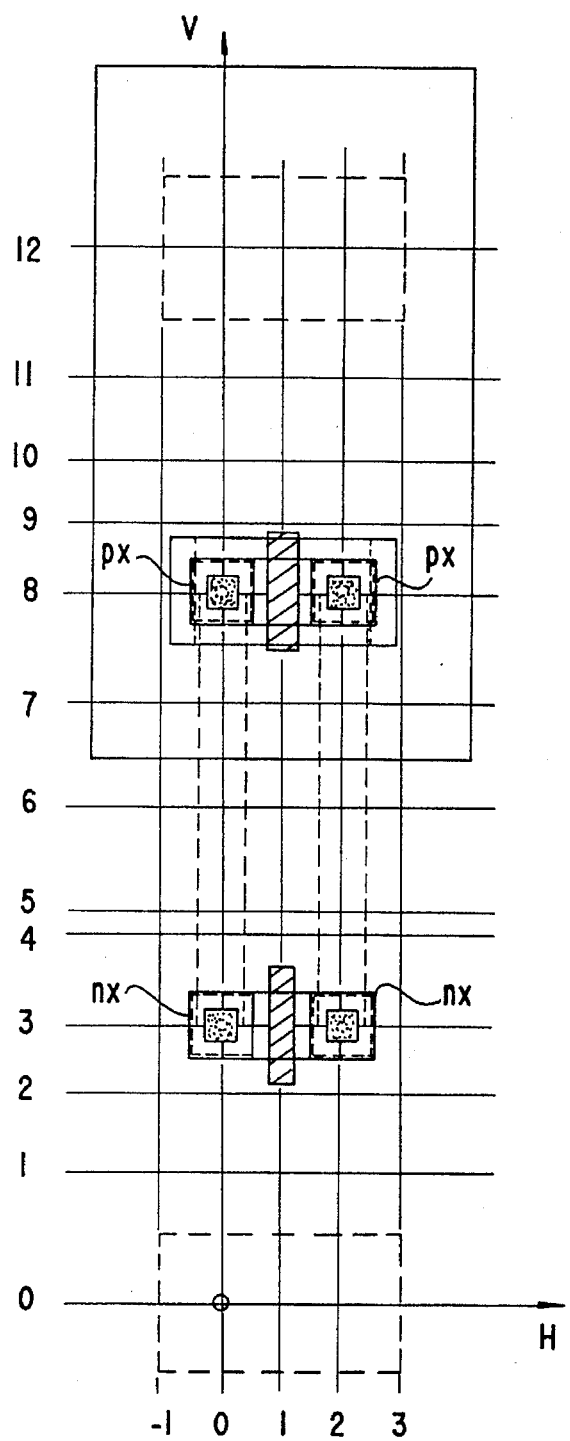
FIG. 11 shows a similar top view of the primitive "ft" and its formation matrix.

Formation matrices of the primitive "f" and that of the transfer gate "ft" are developed in relation to the above grid, and are shown in FIGS. 10 and 11. From these figures and matrices, the relationships between the primitives and the objects used to build them can be easily seen.

Figure 12:
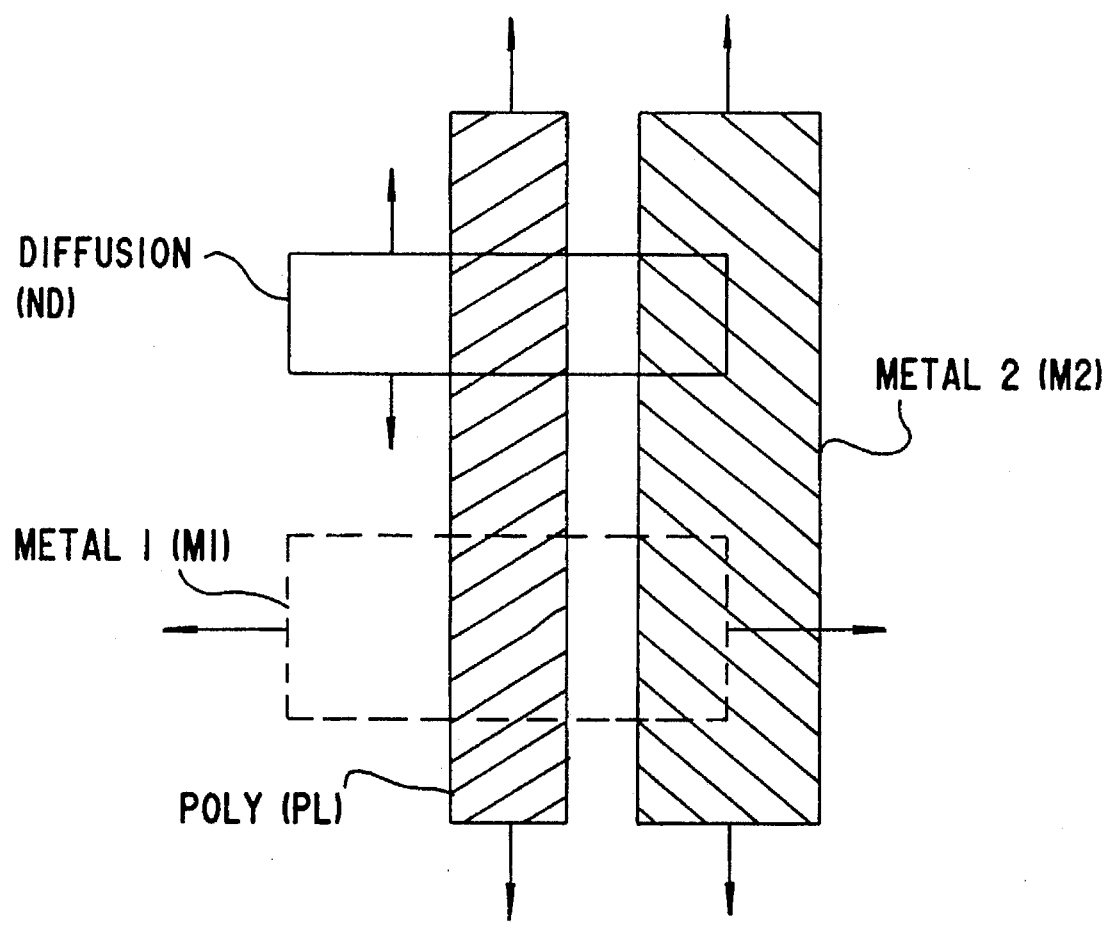
FIG. 12 is a schematic top view showing the orthogonal relationship between conductors.

Referring to FIG. 12, conductors at different topological levels are assigned specific directions of flow. The PL, M2, PD and ND conductors run primarily vertically, or perpendicular to the well edge. Likewise, the M1 lines run mostly horizontally or in the direction parallel to well boundary. Exceptions to this general rule occur, but in well defined and consistent manners. For example, the metal1 segments "c" and "cs" are conducted vertically across well boundary to connect the output nodes of complementary sections of a gate.

A structure is placed at a point by placing its origin at that point. A placement location for a structure is specified by writing its coordinates to the right of the structure name in paranthesis.

It is sometimes convenient to leave the origin location of a structure unchanged when it is mirrored. For example, the origin of the primitive p12 in FIG. 8.1 is shown on the horizontal symmetry axis of its bottom "pr" (VSS) ½ HPS left of its vertical symmetry axis. The origin of the mirrored-in-x p12 can also be located on the horizontal symmetry axis of its bottom "pr" (VSS) ½ HPS left of its vertical symmetry axis (see also FIG. 14).

Given these conventions, the gate formation is defined as follows (see also FIGS. 13 and 14):

Inverter: p11(0,0), nx(2,3), c(2,3); or pb11(0,0), px(2,8), c(2,3). (FIG. 13)

Nand, 2 input: p11(0,0), p12(2,0), nx(4,3), cs(4,3). (FIG. 13)

Figure 14B:
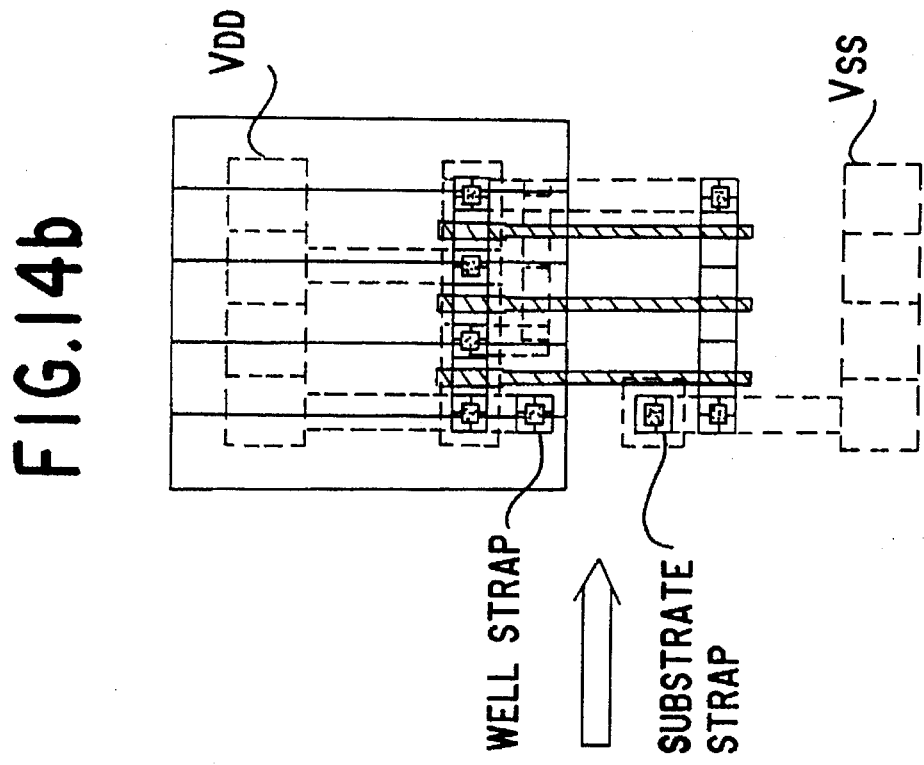
FIG. 14 shows similar procedures to those in FIG. 13 for the construction of a 3-input hand gate and a 3-input nor gate.
Figure 14A:
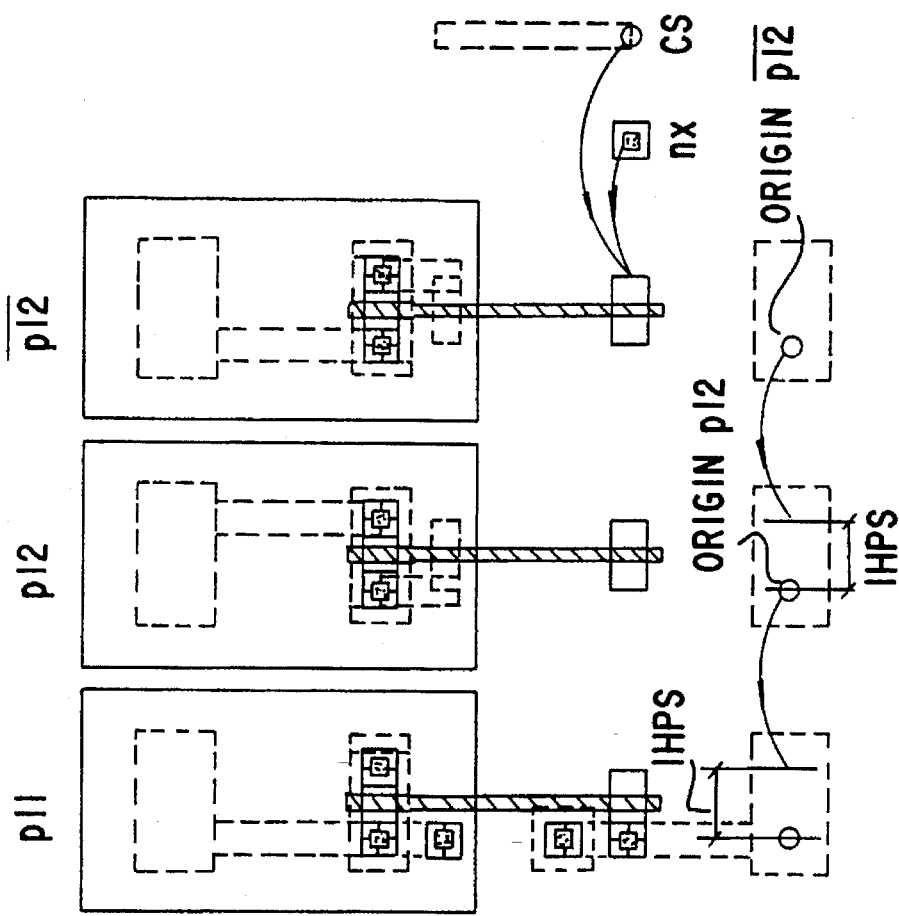

Nand, 3 input: p11(0,0), p12(2,0), p12(4,0), nx(6,3), cs(6,3). (FIG. 14)

Nand, 4 input: p11(0,0), p12(2,0), p12(4,0), p12(6,0), nx(8,3), cs(8,3). (Not shown)

This procedure (or algorithm) can be extended to any higher-number-inputs nand gates. For example, for a nand gate with n inputs, p11 is placed at the location (0,0), followed by p12 placed n-1 times, alternately in its normal and mirrored-in-x orientations, each position being shifted from the previous one by an HPS towards the right, and then followed by nx and cs at the grid location (2n,3).

With respect to nor gate formation, they are similarly defined as follows (FIGS. 13 and 14):

Nor, 2 input: pb11(0,0), pb12(2,0), px(4,8), cs(4,4). (FIG. 13)

Nor, 3 input: pb11(0,0), pb12(2,0), pb12(4,0), px(6,8), cs(6,4). (FIG. 14)

Nor, 4 input: pb11(0,0), pb12(2,0), pb12(4,0), pb12(6,0), px(8,8), cs(8,4). (Not shown)

The procedure for nor gates is similar to that for the nand gates given above, and can likewise be generalized. For example, for a nor gate with n inputs, pb11 is placed at the location (0,0), followed by pb12 placed n-1 times alternately in its normal and mirrored-in-x orientations, each being an HPS apart from the previous one towards the right, to be then followed by px at (2n,8), and cs at (2n,4).

Figure 15:
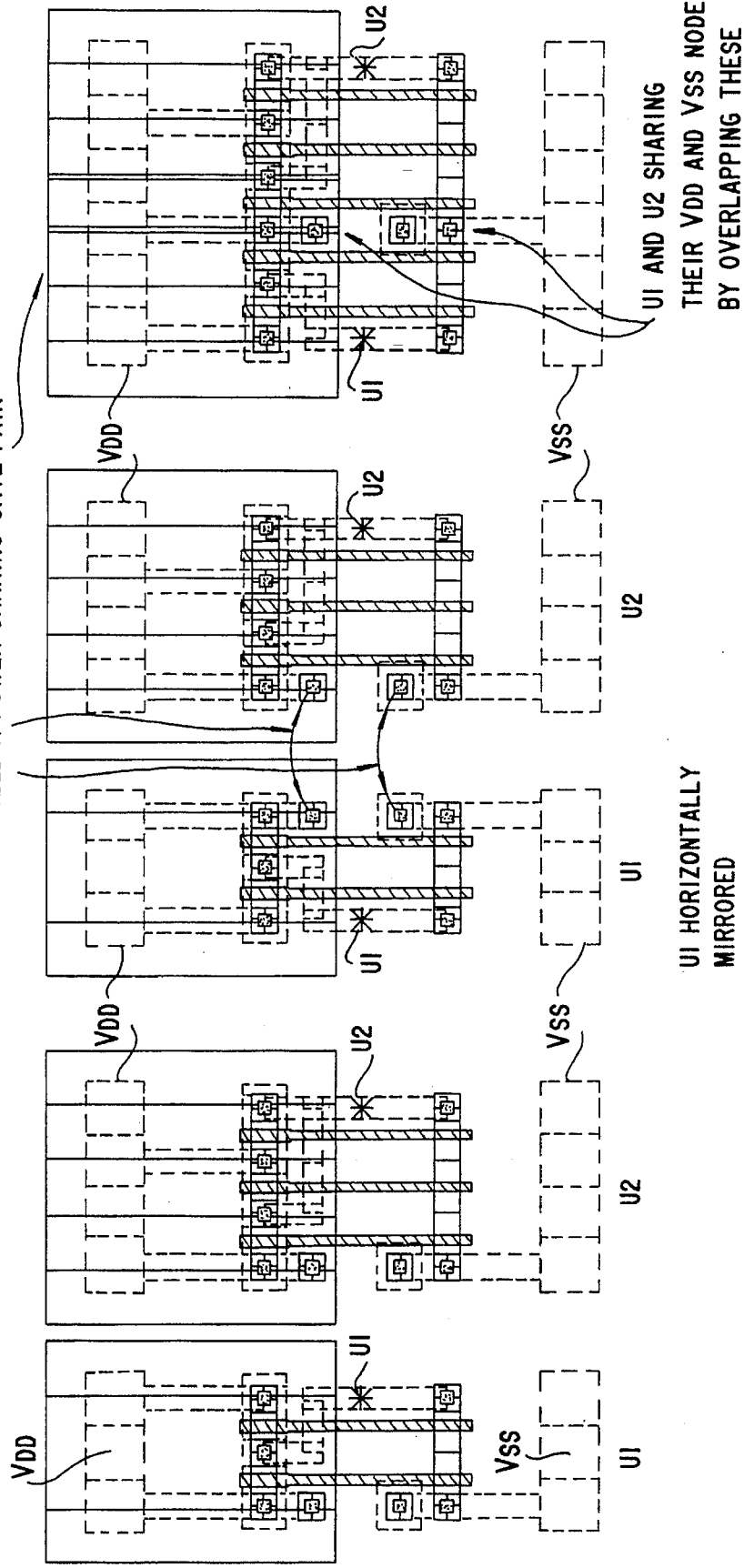
FIG. 15 is a schematic top view showing the sharing of power and ground nodes between gates.

Referring to FIGS. 13 and 14, the power and ground lines (VDD and VSS) for gates are conducted in metal1 horizontally to enclose only the transistor geometries. This arrangement permits placing of the well and substrate straps (or ties) at the well/substrate boundary region with direct metal1 connections to the VDD and VSS lines, thus maximizing the circuit's immunity to CMOS latch up. It is seen from FIGS. 13 and 14 that for the gates constructed by the above procedures the VDD and VSS nodes always lie on their left side. Therefore, if a gate is horizontally mirrored, its VDD and VSS nodes can overlap similar nodes of the next gate. This is referred to as power node sharing between gates. This arrangement saves an HPS space every two gates. Accordingly, power nodes are shared pairwise between ordinary gates, enhancing the circuit's area density. An example of such pairwise power node sharing between gates is shown in FIG. 15, wherein the left gate is mirrored in the x direction and the two gates are then mutually overlapped at their VDD/VSS nodes.

Nodes other than the power and ground (VDD and VSS) nodes, which are called active nodes, can sometimes also be shared between adjacent gates. An example is an inverter (or any gate with an odd number of inputs) driving a transfer gate node; in such a case, the inverter can share the transfer gate node with its own output node. This situation is considered in the methodology of the invention to develop strategies to maximize node sharing between neighboring gates. The optimization of node sharing for complex gates is described in the following discussion concerning their formation process.

Figure 16A:
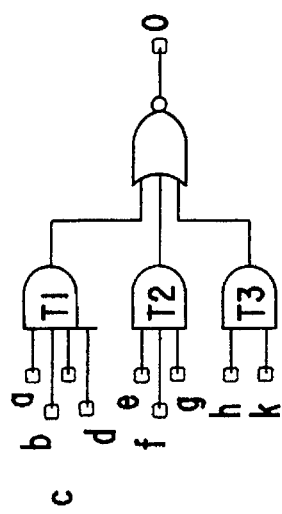
FIG. 16 shows a schematic of an and-or-invert complex gate as an example. Both the gate level and transistor level representations are shown.

Referring to FIG. 16, although efficient procedures to construct complex gates of any practical number of logic levels can be developed, only those of the two logic levels are described here. Complex gates of this variety are commonly referred to as the and-or-invert and the or-and-invert gates. Such gates can be considered as the logic nands or nors of inputs that are not independent, but are themselves the "or" or "and" functions of some other variables. Following standard nomenclature, these first-level functions are called "terms." The schematic in FIG. 16 is an and-or-invert gate with three terms named T1, T2 and T3. The formation process of these terms is analogous to the formation of nand and nor gates, as described above. Note that the order of physical placement of the terms within a complex gate is determined by the need to minimize the area required to implement it and to minimize its parasitic nodal capacitances. In addition, it is desirable to configure a complex gate such that it can share its VDD and VSS nodes with those of a gate next to it, thus reducing the area usage further.

Figure 16B:
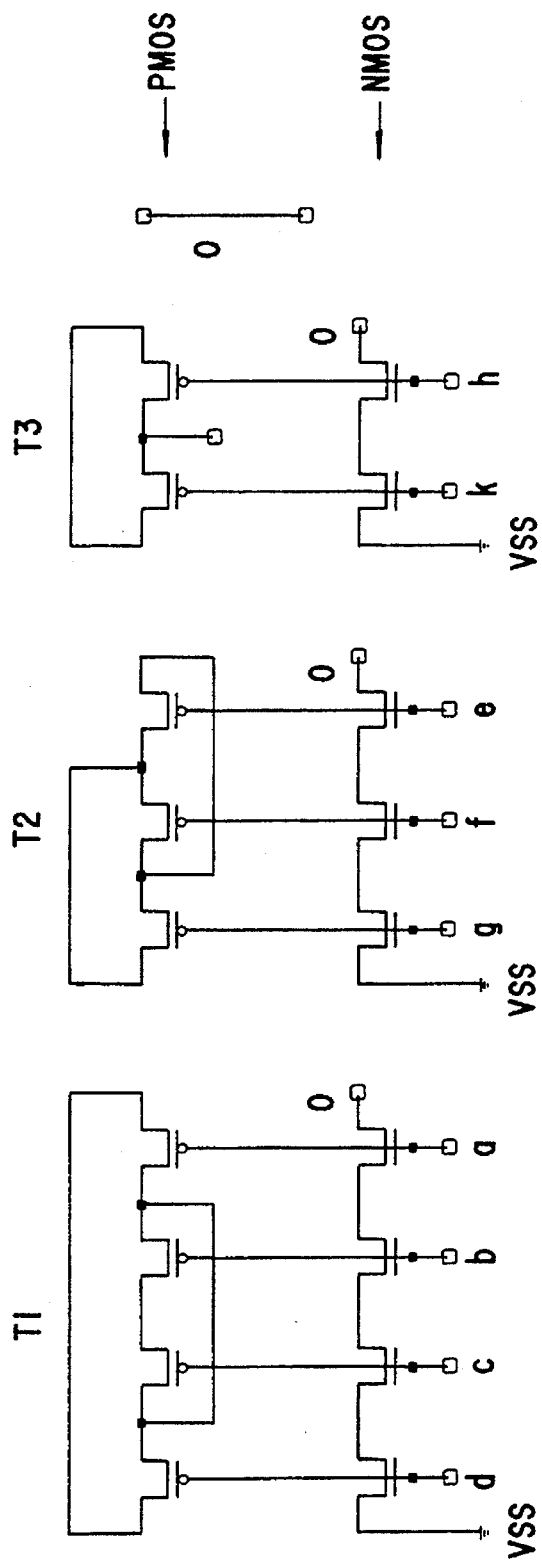

In the transistor level representation of FIG. 16b, the PMOS sections of the terms are shown uncommited with respect to their mutual order and connections between the VDD and the gate output node 0. The task is to systematically find an order so that the area to implement such gates is minimized. Obviously, an order in which all gaps between the nodes are avoided will be the most compact. Thus, the goal is to maximize node sharing between the terms, and to configure the gate such that its VDD and VSS nodes are on one side only (left or right). It is observed from FIG. 16b, that the terms with odd number of inputs can share diffusion nodes on both sides of them, while the terms with even number of inputs can share nodes on only one side. Therefore, in a series connection of the PMOS sections of terms, the odd number of inputs terms will enable continuous node sharing. Since we also want a gate to share power with the next gate, we place all odd-numbered-inputs terms of a complex gate towards the side of its VDD/VSS connections. For convenience of reference, let this side be on the left. Then, the rules developed for the placement of terms within a complex gate are as follows:

1. The left most nodes of a complex gate are assumed to be the VDD and VSS nodes (power and ground).

2. Starting from the left, all terms with odd number of inputs are located first. Node sharing is continuous through these terms and the first even-number-of-inputs term.

3. From the second even-number-of-inputs term onward, the common nodes are pairwise shared between such terms.

4. Starting with the first even-number-of-inputs term, every other term is horizontally flipped (mirrored-in-x) to enable it to share common nodes with the next term.

5. Since the nodes on one side of the first-placed (left most) term are connected to the supply lines, it can be formed in the same way as an ordinary gate using p11 and p12, except that the vertical object c or cs is not used at its output terminals.

Figure 17A:
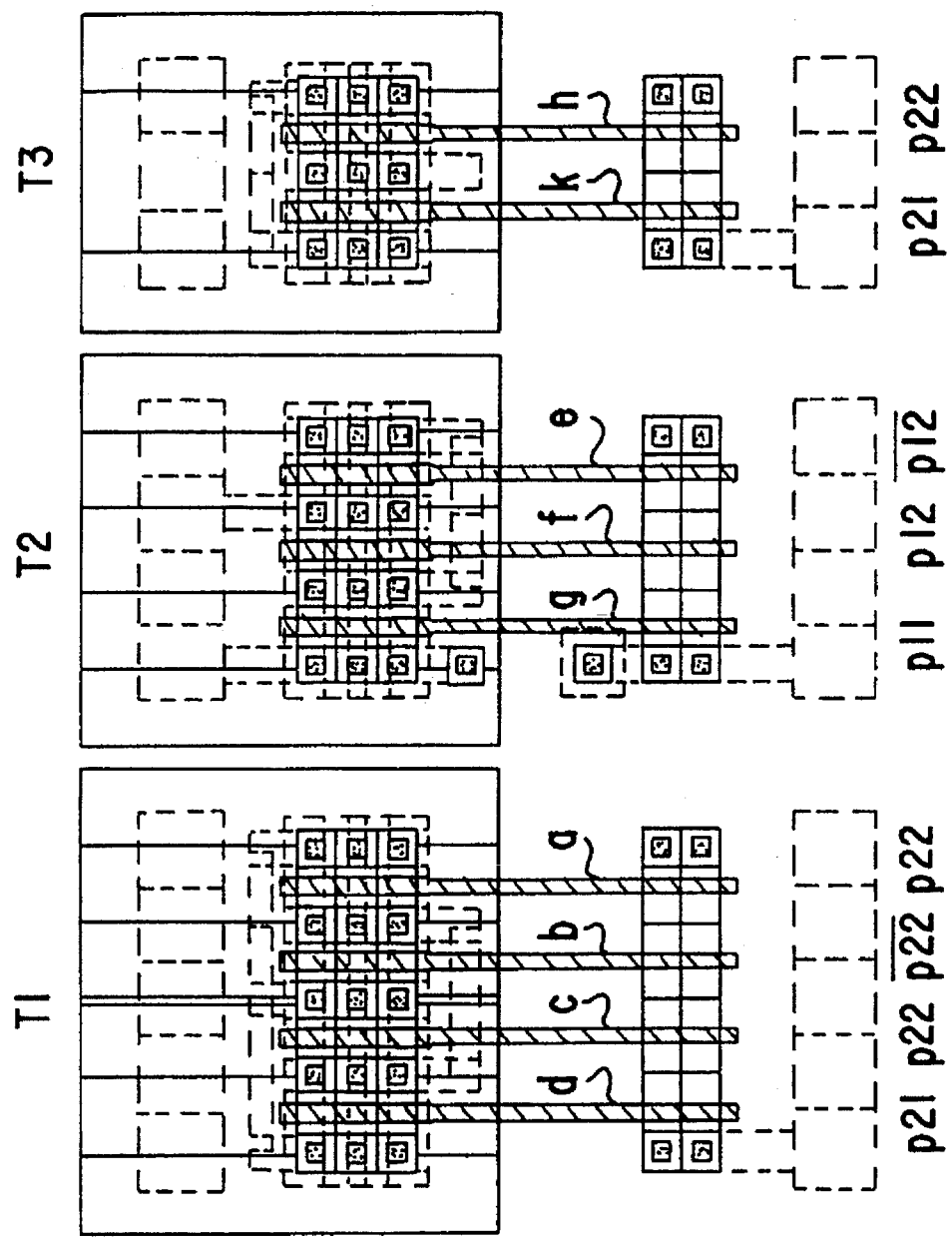
FIG. 17 is a schematic top view showing the formation process of the complex gate depicted in FIG. 16.

None of the remaining terms (other than the first one) of an and-or-invert gate have any node connected to VDD. Therefore, two different primitives, namely p21 and p22, are used to form these terms. Two additional primitives, pb21 and pb22, are developed to construct similar terms of the or-and-invert gates. Since the gate example of FIG. 16 is of the and-or-invert type, only p21 and p22 will be used to construct all other than its first term. As stated, this gate has 3 terms, T1, T2 and T3, of which the only odd-number-of-inputs term is T2, having three inputs. T2 is then the first term of this gate and is constructed with p11 and p12 only. The formation matrix of T2 is as follows (see also FIG. 17a):

First term (T2): p11(0,0), p12(2,0), p12(4,0), pfet(0,9),(2,9),(4,9), pfet(0,10),(2,10),(4,10), px(0,9),(2,9),(4,9),(6,9), nfet(0,2),(2,2),(4,2), nx(6,2),(6,3).

It is noted that the objects pfet, px, nfet and nx in the T2 matrix are used only to scale the transistor sizes so that they match those which are constructed by using the complex gate primitives. Thus, these objects are used for sizing and not for term formation as such.

All other terms are constructed using the complex gate primitives, p21 and p22. In the example of FIG. 16, each of the two remaining terms has an even number of inputs, T1 having four and T3 having two. Unless specified otherwise, either one can be placed next to T2 without any area penalty. The formation matrices for these are:

T1: p21(0,0), p22(2,0), p22(4,0), p22(6,0), m11(0,11), (2,11), (4,11), (6,11), (2,7), (4,7), nx(s,2), (s,3).

T3: p21(0,0), p22(2,0), m11(0,11), (2,0), nx(4,2), (4,3).

Figure 17C:
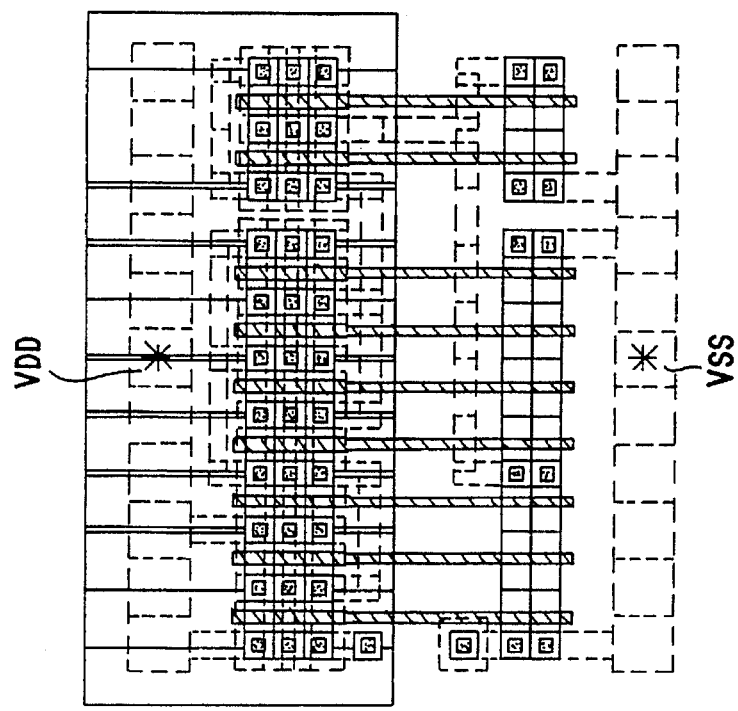
Figure 17B:
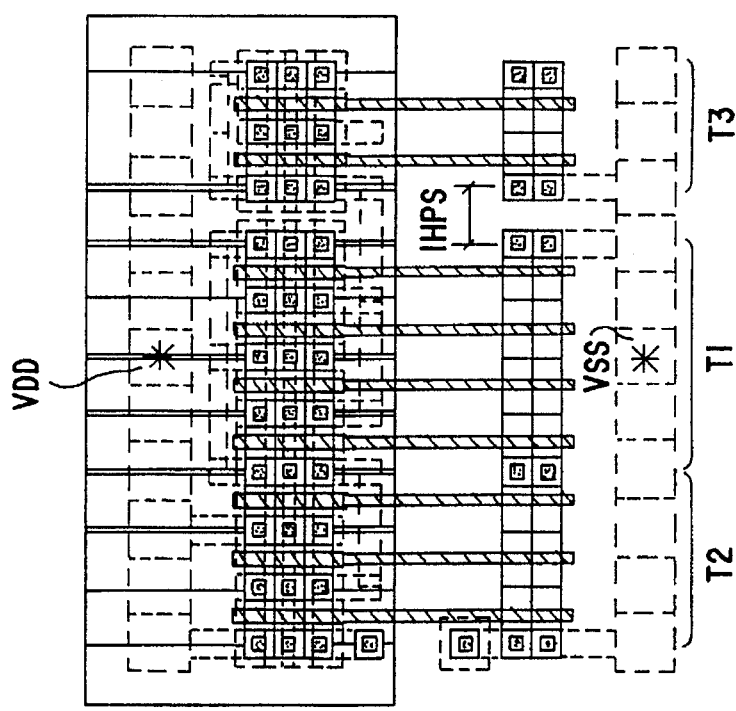

In the example, T1 is selected to be placed second and T3 last. Therefore, the order of terms in the gate is T2, T1 and T3. T2 is placed first and is connected at its left nodes to VDD and VSS. T1 is placed next to right of T2, with its left nodes overlapping the right nodes of T2. T3 is placed next but, according to the rules given above, is first mirrored-in-x. Since T1 has 4 inputs (even number), and has already shared nodes with T2 on one side, T1 cannot share nodes with any other structure (because, as explained above, structures with an even numbered of inputs can share nodes only on one side). Therefore, T3 which is to be placed next (and last), cannot share nodes with T1. Because of this, it is placed one HPS further right of the right nodes of T1. The resulting structure is shown in FIG. 17b. Adding the necessary number of objects e, m11 and cs at appropriate locations yields the required complex gate (see FIG. 17c). The formation matrix of this gate is:

T2(0,0), T1(6,0), T3(16,0), e(6,3), e(20,3), m11(8,5),(10,5),(12,5),(14,5),(16,5), cs(18,4).

Although the grid points that are used above are specific to this example, the procedure described in the rules for complex gates formation is generally applicable. The same rules are applicable to the or-and-invert gates, where the primitives pb11, pb12, pb21, and pb22 are used instead of the ones used above.

While the invention has been particularly shown and described with reference to its preferred embodiments, it will be understood by those skilled in the art that the foregoing and other changes in form and details may be made therein without departing from the spirit and scope of the invention. For example, it would be obvious to those skilled in the art to integrate the devices and methods described herein with computer algorithms in order to automate the process.

I claim:

1. An apparatus for forming integrated circuit structures, comprising:

at least a pair of CMOS field effect transistors (FETs); and means for generating a plurality of integrateable device structures of at least objects and for operably coupling said plurality of integrateable device structures of at least said objects to said pair of CMOS field effect transistors (FETs), wherein said objects include:

at least a pair of segments (pr) in a first metal serving, while providing a given maximum operational rms current to circuits by generating less than a given maximum of resistive voltage drop, as a link for power rails (VDD and VSS) of a row of gates, said horizontal segment having a length being equal to two horizontal pitch spaces (HPS), wherein one horizontal pitch space is given by an expression as follows:

$$HPS=DCS+2\ S0(PL,\ (PD\ or\ Nd))+W0(PL),$$

wherein DCS is a diffusion contact space and is equal to a sum of a minimum contact feature size and twice a diffusion overlap of contact, wherein SO(PL, (PD or ND)) is a minimum spacing between poly and diffusion (PD or ND) conductors, and wherein W0(PL) is a minimum feature size of a polysilicon conductor, at least a p-channel field effect transistor (pFET), a box (nw1) of an n-well of a width equal to a sum of said horizontal pitch space (HPS), said diffusion contact space (DCS), and twice a minimum overlap of an n-well over a p-type diffusion (PD), and of a height equal to a p-type diffusion height and twice an overlap of said n-well over said p-type diffusion (PD), at least an n-channel field effect transistor (nFET), and a vertical segment (pl1) of a polysilicon having a width equal to a minimum feature size of said polysilicon conductor, wherein one of said pair of horizontal segments (pr) is located at a first location and another one of said pair of segments (pr) is located at a second location of a grid system, and wherein said p-channel field effect transistor (pFET), said n-channel field effect transistor (nFET), said vertical segment (pl1) and said box (nw1) are located at third, fourth, fifth and sixth locations, respectively, of said grid system.

* * * * *

UNITED STATES PATENT AND TRADEMARK OFFICE
CERTIFICATE OF CORRECTION

PATENT NO.:   5,536,955
DATED     :   July 16, 1996
INVENTOR(S):  Akhtar ALI

It is certified that errors appear in the above-identified patent and that said Letters Patent is hereby corrected as shown below:

The object depicted in Figures 1c and 2c should be labeled "AC(ND)".

The object depicted in Figure 2f should be labeled as "mx".

The object depicted in Figure 3c should be labeled "px".

The object depicted in Figure 3d should be labeled "plx".

```
Col. 4, line 52, "3-input hand gate" should read --3-input
nand gate--
Col. 5, line 33, "metall segment" should read --metal2 segment--
```

Column 14, lines 4 and 6 should have a bar placed on top of "p12" and also on top of "pb12" in lines 19 and 21, i.e. "$\overline{p12}$" and "$\overline{pb12}$".

Signed and Sealed this

Twenty-fourth Day of February, 1998

*Attest:*

BRUCE LEHMAN

*Attesting Officer*   *Commissioner of Patents and Trademarks*